United States Patent
Gardner et al.

(10) Patent No.: US 12,543,369 B2
(45) Date of Patent: Feb. 3, 2026

(54) TRANSISTOR STACKING BY WAFER BONDING

(71) Applicant: Tokyo Electron Limited, Tokyo (JP)

(72) Inventors: Mark I. Gardner, Cedar Creek, TX (US); H. Jim Fulford, Marianna, FL (US)

(73) Assignee: Tokyo Electron Limited, Tokyo (JP)

( * ) Notice: Subject to any disclaimer, the term of this patent is extended or adjusted under 35 U.S.C. 154(b) by 661 days.

(21) Appl. No.: 17/884,192

(22) Filed: Aug. 9, 2022

(65) Prior Publication Data
US 2023/0207397 A1 Jun. 29, 2023

Related U.S. Application Data

(60) Provisional application No. 63/294,477, filed on Dec. 29, 2021.

(51) Int. Cl.
*H10D 86/01* (2025.01)
*H01L 21/762* (2006.01)
*H10D 86/00* (2025.01)

(52) U.S. Cl.
CPC ....... *H10D 86/01* (2025.01); *H01L 21/76251* (2013.01); *H10D 86/201* (2025.01)

(58) Field of Classification Search
CPC ...... H10D 84/856; H10D 89/10; H10D 86/01; H10D 86/201; H10D 88/00; H10D 30/014; H10D 30/43; H01L 25/0657; H01L 21/2007
See application file for complete search history.

(56) References Cited

U.S. PATENT DOCUMENTS

| | | | |
|---|---|---|---|
| 2006/0073644 A1* | 4/2006 | Atoji | H01L 21/76259 438/479 |
| 2012/0248544 A1* | 10/2012 | Yokoyama | H01L 23/481 438/455 |
| 2020/0403097 A1* | 12/2020 | Wang | H10D 30/6758 |
| 2023/0197721 A1* | 6/2023 | Bao | H10D 88/00 257/369 |

* cited by examiner

*Primary Examiner* — Changhyun Yi
(74) *Attorney, Agent, or Firm* — Oblon, McClelland, Maier & Neustadt, L.L.P.

(57) ABSTRACT

A method of fabricating a semiconductor device includes receiving a first wafer including a first substrate on a backside of the first wafer, and a first semiconductor-on-insulator (SOI) stack on a front side of the first wafer. The first SOI stack includes a first semiconductor. A second wafer is received that includes a second substrate on a backside of the second wafer, and a second SOI stack on a front side of the second wafer. The second SOI stack includes a second semiconductor. The front side of the first wafer is bonded to the front side of the second wafer, via at least one dielectric bonding material, to form a bonded wafer. The second substrate is removed. A stack of transistor devices is formed with the first semiconductor used as a first channel for a first transistor and the second semiconductor used as a second channel for a second transistor.

20 Claims, 31 Drawing Sheets

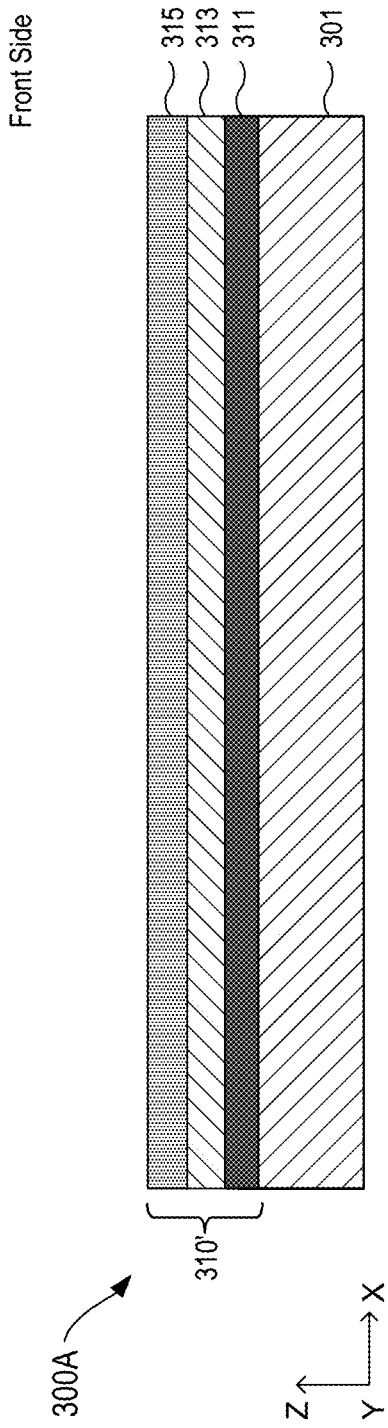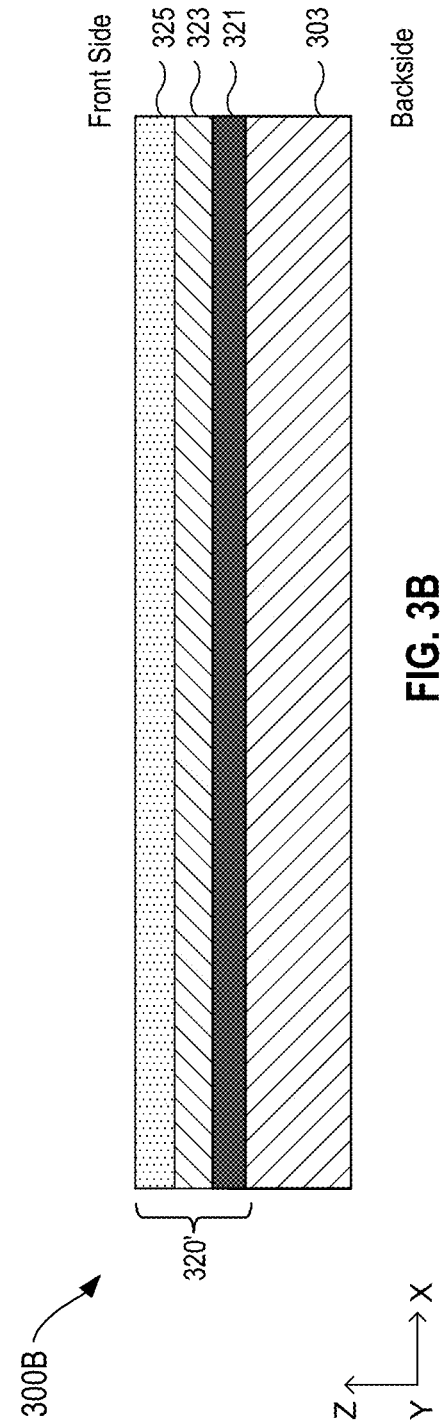
FIG. 3A
FIG. 3B

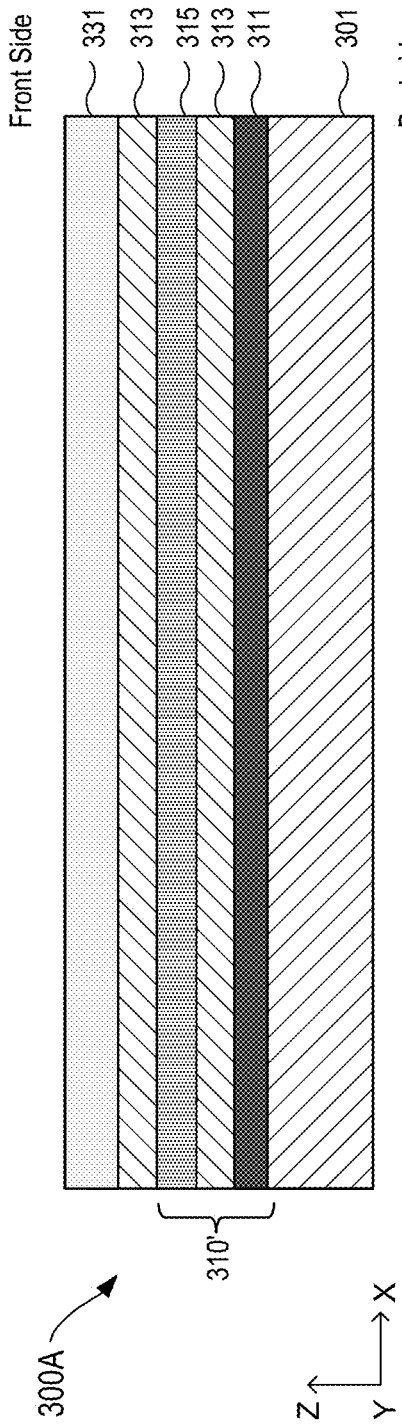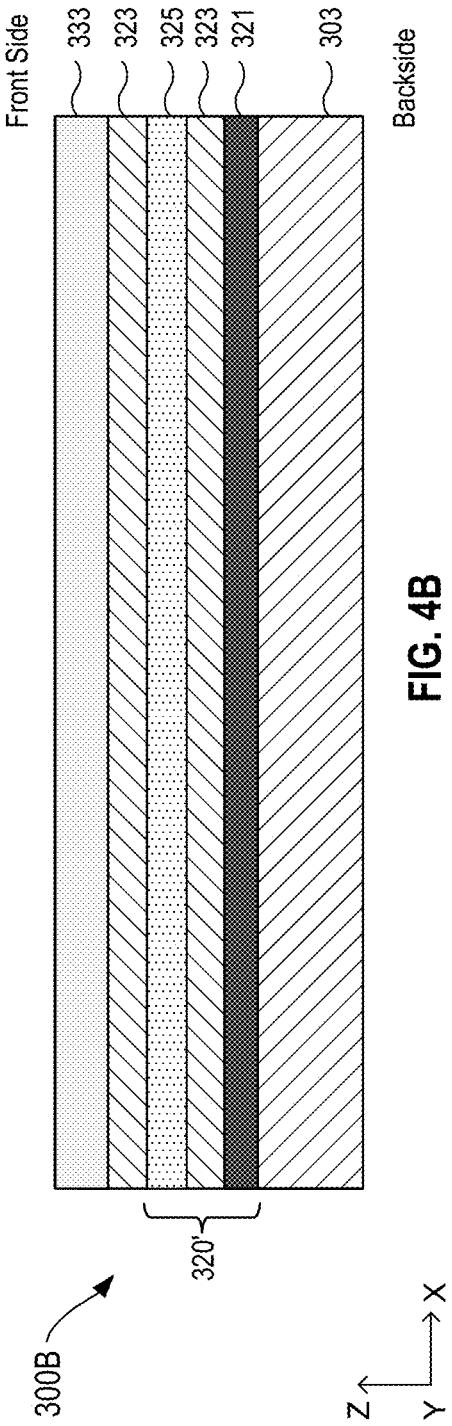
FIG. 4A
FIG. 4B

TRANSISTOR STACKING BY WAFER BONDING

INCORPORATION BY REFERENCE

This present disclosure claims the benefit of U.S. Provisional Application No. 63/294,477, filed on Dec. 29, 2021, which is incorporated herein by reference in its entirety.

FIELD OF THE INVENTION

This disclosure relates to microelectronic devices including semiconductor devices, transistors, and integrated circuits, and methods of microfabrication.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

SUMMARY

The present disclosure relates to a semiconductor device and a method of fabricating the same.

According to a first aspect of the disclosure, a method of fabricating a semiconductor device is provided. The method includes receiving a first wafer including a first substrate on a backside of the first wafer, and a first semiconductor-on-insulator (SOI) stack on a front side of the first wafer. The first SOI stack includes a first semiconductor. A second wafer is received that includes a second substrate on a backside of the second wafer, and a second SOI stack on a front side of the second wafer. The second SOI stack includes a second semiconductor. The front side of the first wafer is bonded to the front side of the second wafer, via at least one dielectric bonding material, to form a bonded wafer. The second substrate is removed from the bonded wafer. A stack of transistor devices is formed with the first semiconductor used as a first channel for a first transistor and the second semiconductor used as a second channel for a second transistor.

In some embodiments, the bonding the front side of the first wafer to the front side of the second wafer includes bonding a first dielectric layer, which is on the front side of the first wafer, to a second dielectric layer, which is on the front side of the second wafer.

In some embodiments, the first dielectric layer and the second dielectric layer include a same dielectric bonding material. The bonding the first dielectric layer to the second dielectric layer includes performing fusion bonding.

In some embodiments, the first SOI stack includes a first insulator, a second insulator over the first insulator, and the first semiconductor over the second insulator. The first insulator and the second insulator are configured to be etch-selective to each other. The second SOI stack includes a third insulator, a fourth insulator over the third insulator, and the second semiconductor over the fourth insulator. The third insulator and the fourth insulator are configured to be etch-selective to each other.

In some embodiments, the second insulator is formed on the first semiconductor. The fourth insulator is formed on the second semiconductor.

In some embodiments, the bonded wafer is patterned to form at least one layer stack over the first substrate. The at least one layer stack includes the first semiconductor over the first substrate, the at least one dielectric bonding material over the first semiconductor, and the second semiconductor over the at least one dielectric bonding material.

In some embodiments, opposing sidewalls of the at least one layer stack are uncovered. Source/drain (S/D) regions are formed on opposing sides of the first semiconductor and opposing sides of the second semiconductor.

In some embodiments, opposing sidewalls of the at least one layer stack are uncovered. Top and bottom surfaces of the first semiconductor and top and bottom surfaces of the second semiconductor are uncovered. Gate structures are formed around the first semiconductor and the second semiconductor.

In some embodiments, opposing sidewalls of the at least one layer stack are uncovered. End portions of insulator layers are replaced with dielectric spacers. The insulator layers are respectively in direct contact with the first semiconductor and the second semiconductor.

In some embodiments, the receiving the first wafer includes forming the first SOI stack over the first substrate. The receiving the second wafer includes forming the second SOI stack over the second substrate.

In some embodiments, the first semiconductor and the second semiconductor include a same semiconductor.

In some embodiments, the first semiconductor and the second semiconductor include different semiconductors.

According to a second aspect of the disclosure, a semiconductor device is provided. The semiconductor device includes a substrate and a stack of transistors over the substrate. The stack of transistors includes a first transistor and a second transistor stacked over the first transistor. An isolation structure is positioned between the first transistor and the second transistor. The isolation structure includes a first dielectric layer, which is in direct contact with a first gate structure of the first transistor, and a second dielectric layer, which is in direct contact with a second gate structure of the second transistor. The first dielectric layer is bonded to the second dielectric layer.

In some embodiments, the first dielectric layer and the second dielectric layer include a same dielectric.

In some embodiments, the first dielectric layer is bonded seamlessly to the second dielectric layer.

In some embodiments, the first dielectric layer is bonded to the second dielectric layer with one or more bonding defects at a bonding interface between the first dielectric layer and the second dielectric layer.

In some embodiments, the one or more bonding defects include at least one selected from the group consisting of a non-bonded area, a void, a trapped particle and a crack.

In some embodiments, at least one channel of the stack of transistors includes an elemental semiconductor or a compound semiconductor.

In some embodiments, the first transistor includes a first channel that is single crystalline. The second transistor includes a second channel that is single crystalline.

In some embodiments, the first transistor includes a single first channel. The second transistor includes a single second channel.

In some embodiments, the first transistor includes a first channel surrounded by the first gate structure, and first S/D regions on opposing ends of the first channel. The second transistor includes a second channel surrounded by the second gate structure, and second S/D regions on opposing ends of the second channel.

In some embodiments, when viewed from a vertical direction substantially perpendicular to a working surface of the substrate, the isolation structure completely overlaps with a first structure consisting of the first channel and the first S/D regions. When viewed from a vertical direction substantially perpendicular to a working surface of the first substrate, the isolation structure completely overlaps with a second structure consisting of the second channel and the second S/D regions.

In some embodiments, the first semiconductor and the second semiconductor include a same semiconductor.

In some embodiments, the first semiconductor and the second semiconductor include different semiconductors.

According to a third aspect of the disclosure, a method of fabricating a semiconductor device is provided. The method includes bonding a front side of a first wafer to a front side of a second wafer to form a first bonded wafer. The first wafer includes a first substrate and a first gate metal over the first substrate. The first gate metal is positioned on the front side of the first wafer. The second wafer includes a second substrate, a first gate dielectric over the second substrate and a first semiconductor over the first gate dielectric. The first semiconductor is positioned on the front side of the second wafer. A first metal-insulator-semiconductor-insulator-metal (MISIM) stack is formed on a front side of the first bonded wafer. The first MISIM stack includes sequentially the first gate metal, the first gate dielectric, the first semiconductor, the first gate dielectric and the first gate metal. A front side of the first bonded wafer is bonded to a front side of a third wafer to form a second bonded wafer. The third wafer includes a third substrate, a second gate dielectric over the third substrate and a second semiconductor over the second gate dielectric. The third semiconductor is positioned on the front side of the second wafer. A second MISIM stack is formed over the first MISIM stack. The second MISIM stack includes sequentially a second gate metal, the second gate dielectric, the second semiconductor, the second gate dielectric and the second gate metal. A stack of transistor devices is formed by using the first MISIM stack to form a first transistor and using the second MISIM stack to form a second transistor.

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be increased or reduced for clarity of discussion.

FIGS. 3A and 4A show cross-sectional views of a first wafer at various intermediate steps of manufacturing, in accordance with some embodiments of the present disclosure.

FIGS. 3B and 4B show cross-sectional views of a second wafer at various intermediate steps of manufacturing, in accordance with some embodiments of the present disclosure.

DETAILED DESCRIPTION

Figure 1A:
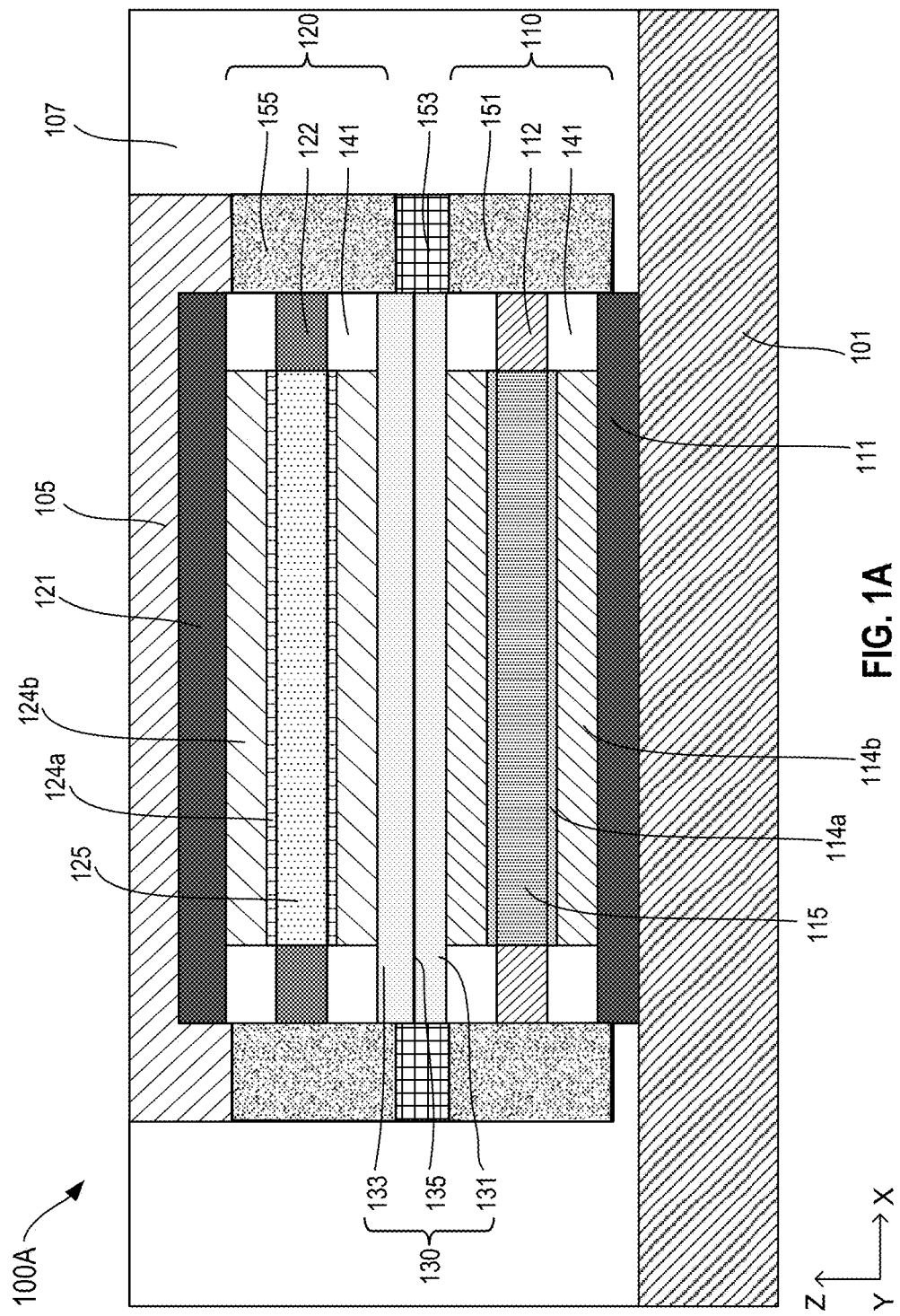
FIG. 1A shows a vertical cross-sectional view of a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

3D integration, i.e. the vertical stacking of multiple devices, aims to overcome scaling limitations experienced in planar devices by increasing transistor density in volume rather than area. Although device stacking has been successfully demonstrated and implemented by the flash memory industry with the adoption of 3D NAND, application to random logic designs is substantially more difficult. 3D integration for logic chips (CPU (central processing unit), GPU (graphics processing unit), FPGA (field programmable gate array, SoC (System on a chip)) is being pursued.

Techniques disclosed herein include methods of microfabrication of semiconductor devices that provide single crystal horizontal nanosheets. Such techniques can enable 3D transistor integration. 3D horizontal nanosheets are enabled herein without using epitaxial growth of horizontal nanosheets or SiGe epitaxial release layers. Instead, techniques herein use wafer bonding with an enhanced single crystal wafers containing at least two different selective dielectric regions.

Because bonding wafers are used, the disposable release material between nanosheets is also achieved without epitaxial growth. Prior to techniques herein, methods included using a SiGe layer. The bonded wafer technique herein provides built-in 3D isolation between devices. No SiGe layer is required to isolate the substrate from horizontal nanosheets because isolation is built into the bonding stack. Such techniques herein eliminate many process steps to make single crystal nanosheets. Separate metal gate electrodes and high K is achieved as well. Both side-by-side and CFET devices can be used with techniques herein. The W/L (width/length) ratio can be easily masked with this integration approach.

FIG. 1A shows a vertical cross-sectional view of a semiconductor device 100A, in accordance with one embodiment of the present disclosure. As illustrated, the semiconductor device 100A includes a substrate 101 and a stack of transistors (e.g. 110 and 120) positioned over the substrate 101.

In a non-limiting example, the semiconductor device 100A includes a first transistor 110 and a second transistor 120 stacked over the first transistor 110. Specifically, the first transistor 110 includes a first channel 115, first S/D regions 112 and a first gate structure 114 (as shown by 114a and 114b) while the second transistor 120 includes a second channel 125, second S/D regions 122 and a second gate structure 124 (as shown by 124a and 124b). Since the first transistor 110 is similar to the second transistor 120, consider the first transistor 110 for example. In the example of FIG. 1A, the first S/D regions 112 are positioned on opposing ends of the first channel 115. During operation, a current is configured to flow from one of the first S/D regions 112 to the other one of the first S/D regions 112, for example in the X direction. The first gate structure 114 is all around the first channel 115 so the first transistor 110 is a gate-all-around (GAA) transistor.

The semiconductor device 100A also includes an isolation structure 130 that is positioned between the first transistor 110 and the second transistor 120. The isolation structure 130 includes a first dielectric layer 131, which is in direct contact with the first gate structure 114 of the first transistor 110, and a second dielectric layer 133, which is in direct contact with the second gate structure 124 of the second transistor 120. The first dielectric layer 131 is bonded to the second dielectric layer 133, for instance by a wafer bonding process. In this example, the first dielectric layer 131 and the second dielectric layer 133 include a same dielectric material, such as silicon oxide, and are bonded to each other by fusion bonding (also known as direct bonding).

In one embodiment, the first dielectric layer 131 is bonded to the second dielectric layer 133 with one or more bonding defects (not shown) at a bonding interface 135 between the first dielectric layer 131 and the second dielectric layer 133. As one having ordinary skill in the art would understand, such bonding defects at the bonding interface 135 can include, but are not limited to, a non-bonded area, a void (e.g. a vacuum or air bubble), a trapped particle, a crack, etc. Such bonding defects can be characteristic of the semiconductor device 100A. In other words, the bonding interface 135 can be different from an interface between two layers where one layer is deposited or formed over the other layer. Such bonding defects can be characterized or detected by known techniques such as acoustic micro-imaging, infrared transmission spectrometry, the double cantilever beam test, the (micro) Chevron test, bonding strength measurement, white light interferometry, etc. In another embodiment, there is no bonding defect at the bonding interface 135. However, the bonding interface 135 may still exist when the first dielectric layer 131 and the second dielectric layer 133 are made of different dielectric materials. In yet another embodiment, the first dielectric layer 131 is bonded seamlessly to the second dielectric layer 133. That is, the bonding interface 135 may not exist when there is no bonding defect at the bonding interface 135, and the first dielectric layer 131 and the second dielectric layer 133 are made of a same dielectric material. Accordingly, the isolation structure 130 can be a unitary piece.

In some embodiments, the isolation structure 130 has a length that is equal to a total length of the first channel 115 and the first S/D regions 112 in the X direction. When viewed from the Z direction, the isolation structure 130 can completely overlap with a first structure consisting of the first channel 115 and the first S/D regions 112, and completely overlap with a second structure consisting of the second channel 125 and the second S/D regions 122.

Further, the semiconductor device 100A can include vertical conductive structures (e.g. 151 and 155). Particularly, the vertical conductive structures 151 are connected to the first S/D regions 112 and separated from the first gate structure 114 by (inner) dielectric spacers 141. The vertical conductive structures 155 are connected to the second S/D regions 122 and separated from the second gate structure 124 by dielectric spacers 141. While not shown, the vertical conductive structures (e.g. 151 and 155) can be electrically connected to a front-side or backside power delivery network. In this example, each middle structure 153 is insulating and thus separates a respective vertical conductive structure 151 from a respective vertical conductive structure 155. In another example, each middle structure 153, the respective vertical conductive structure 151 and the respective vertical conductive structure 155 include a same metal material and together form a common vertical conductive structure for a respective first S/D region 112 and a respective second S/D region 122.

Note that the first channel 115 and the second channel 125 can include different chemical compositions from one another. That is, the first channel 115 and the second channel 125 can include different semiconductor materials, different dopants and/or different dopant concentration profiles. In one example, the first channel 115 includes n-type silicon while the second channel 125 includes p-type silicon. In another example, the first channel 115 includes p-type silicon while the second channel 125 includes n-type silicon. In yet another example, one of the first channel 115 and the second channel 125 includes silicon while the other one of the first channel 115 and the second channel 125 includes germanium. Alternatively, the first channel 115 and the second channel 125 can include a same chemical composition. For instance, the first channel 115 and the second channel 125 can both include p-doped silicon or both include n-doped silicon.

Further, the first channel 115 can include an element semiconductor or a compound semiconductor. The element semiconductor can include, but is not limited to, Si, Ge, Sn, Se, Te, etc. The compound semiconductor can include GaN, GaAs, InP, InGaN and the like, which can be formed epitaxially. The compound semiconductor can also include a non-epitaxial compound semiconductor that does not need to be formed by epitaxy and may or may not be crystalline. The non-epitaxial compound semiconductor can include an oxide semiconductor or a semiconducting oxide, such as $In_2O_3$, $SnO_2$, InGaZnO, CdO, ZnO, SnO and the like. A non-epitaxial compound semiconductor can also include a metal chalcogenide, such as a transition-metal dichalcogenide (TMDC). A TMDC can have a chemical formula of $MX_2$, where M includes a transition metal from Group VI, Group V or Group VI of the periodic table while X includes a chalcogen such as sulfur (S), selenium (Se) or tellurium (Te). More specifically, a TMDC can include a W-based material (e.g. $WS_2$, $WSe_2$ or $WTe_2$), a Mo-based material (e.g. $MoS_2$, $MoSe_2$ or $MoTe_2$), $HfS_2$, $ZrS_2$, $TiS_2$ or the like. A metal chalcogenide may also include a metal monochalcogenide (e.g. GaSe, InSe or SnS), a metal trichalcogenide (e.g. $TiS_3$) or the like. Similarly, the second channel 125 can independently include an element semiconductor or a compound semiconductor.

Additionally, the first channel 115 and the second channel 125 can be single crystalline, for example each including a single crystal of semiconductor material. Further, the first channel 115 and the second channel 125 can have various shapes or geometry, such as nanosheets.

In some embodiments, gate structures (e.g. 114 and 124) each include at least one gate metal (e.g. 114b and 124b), such as a work function metal (WFM), and at least one gate dielectric (e.g. 114a and 124a), such as a high-k dielectric. As can be appreciated, the gate metals 114b and 124b which function as the gate conductors may be the same as or different from each other, and the gate dielectrics 114a and 124a may also be the same as or different from each other, depending on a respective channel (i.e. 115 and 125), design requirements (e.g. gate threshold voltage), etc. Note that the gate metal 114b is disposed all around the first channel 115 while the gate metal 124b is disposed all around the second channel 125. Therefore in this example, the first transistor 110 and the second transistor 120 are each a GAA single-channel transistor. While the gate metal 114b and 124b are both shown as a single material, the gate metal 114b and 124b may each be made up of two or more layers of metals having different work functions. Similarly, the gate dielectric 114a and 124a may be made up of two or more layers of dielectric materials.

In some embodiments, the semiconductor device 100A can include dielectric materials, e.g. as shown by 105, 107, 111, 114a, 121, 124a, 131, 133, 141 and 153. The dielectric materials may also be referred to as isolation structures, isolation layers, diffusion breaks, inner spacers, gate dielectrics, capping layers, etc. depending on functions thereof. For example, the dielectric material 105 can function as and be referred to as a capping layer. Additionally, some of the dielectric materials may include identical materials or may include different materials. For example, the dielectric materials 111, 121, 131 and 133 may include a same dielectric material such as silicon oxide.

In the example of FIG. 1A, only one stack of transistors is shown. Of course it should be understood that the semiconductor device 100A can include any number of stacks of transistors arranged in the XY plane over the substrate 101 and separated from each other, for example by the dielectric material 107. Each stack can include any number of transistors stacked in the Z direction, and each two neighboring transistors in the Z direction can be separated by a respective isolation structure 130.

Figure 1B:
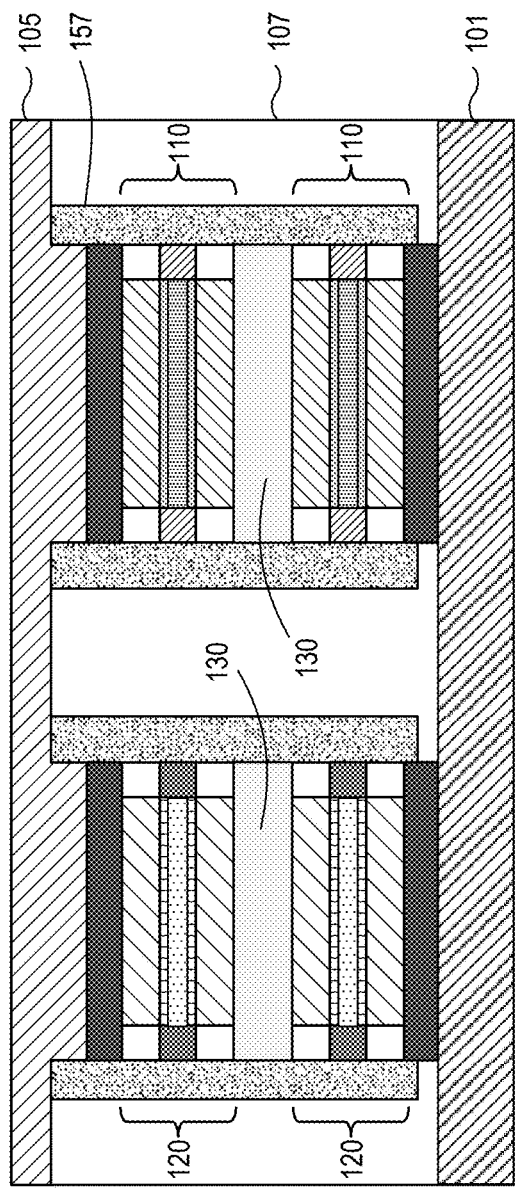
FIG. 1B shows a vertical cross-sectional view of a semiconductor device in accordance with another embodiment of the present disclosure.

FIG. 1B shows a vertical cross-sectional view of a semiconductor device 100B in accordance with another embodiment of the present disclosure. Since the embodiment of the semiconductor device 100B is similar to the embodiment of the semiconductor device 100A, descriptions herein will be provided with emphasis placed on difference. Note that similar or identical components are labeled with similar or identical numerals unless specified otherwise.

Herein, the semiconductor device 100B includes a plurality of stacks of transistors. For example, a first stack of transistors includes two first transistors 110 stacked over each other and common vertical conductive structures 157 for the two first transistors 110. The two first transistors 110 are separated from each other by an isolation structure 130. Similarly, a second stack of transistors includes two second transistors 120 stacked over each other and common vertical conductive structures 157 for the two second transistors 120. The two second transistors 120 are separated by another isolation structure 130.

Figure 2:
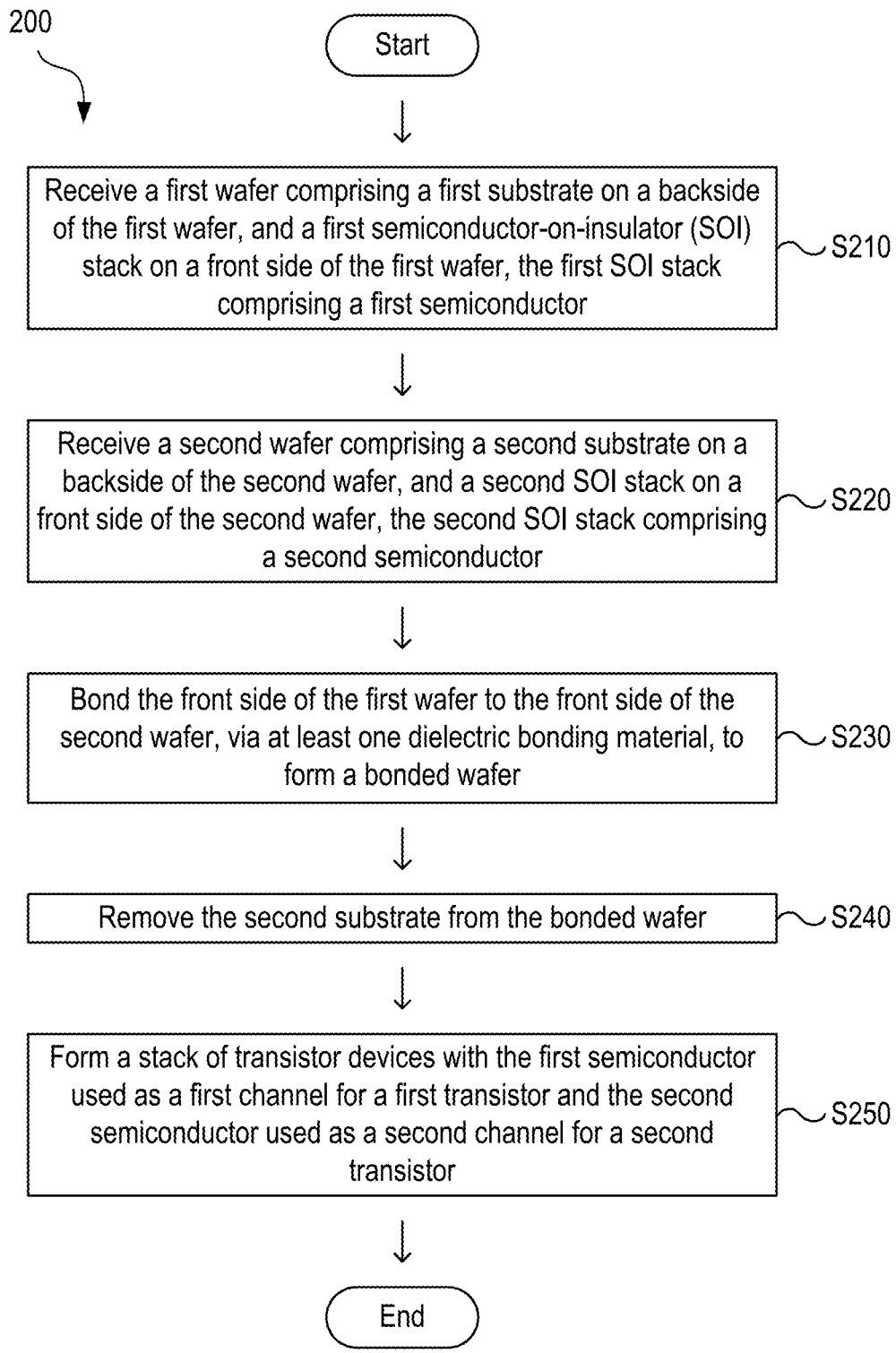
FIG. 2 shows a flow chart of a process for manufacturing a semiconductor device, in accordance with some embodiments of the present disclosure.

FIG. 2 shows a flow chart of a process 200 for manufacturing a semiconductor device, such as the semiconductor device 100A, 100B or the like, in accordance with some embodiments of the present disclosure. The process 200 begins with Step S210 by receiving a first wafer including a first substrate on a backside of the first wafer, and a first semiconductor-on-insulator (SOI) stack on a front side of the first wafer. The first SOI stack includes a first semiconductor. At Step S220, a second wafer is received that includes a second substrate on a backside of the second wafer, and a second SOI stack on a front side of the second wafer. The second SOI stack includes a second semiconductor. At Step S230, the front side of the first wafer is bonded to the front side of the second wafer, via at least one dielectric bonding material, to form a bonded wafer. At Step S240, the second substrate is removed from the bonded wafer. At Step S250, a stack of transistor devices is formed with the first semiconductor used as a first channel for a first transistor and the second semiconductor used as a second channel for a second transistor.

FIG. 3A show a cross-sectional view of a first wafer 300A, in accordance with one embodiment of the present disclosure. The first wafer 300A includes a first substrate 301 on a backside of the first wafer 300A, and a first semiconductor-on-insulator (SOI) stack 310' on a front side of the first wafer 300A. The first SOI stack 310' includes a first insulator 311, a second insulator 313 over the first insulator 311, and a first semiconductor 315 over the second insulator 313. The first insulator 311 and the second insulator 313 are configured to be etch-selective to each other. Note that the first semiconductor 315 can be single crystalline.

The first wafer 300A can be received, e.g. provided by a third party or oneself. For example, the first SOI stack 310' can be formed over the first substrate 301. Known in the art are methods for forming traditional SOI wafers (e.g. Si-on-insulator, Ge-on-insulator, SiGe-on-insulator or the like) where only a single insulator is formed between a substrate and a semiconductor. Techniques herein include forming an SOI wafer where at least two etch-selective insulators (e.g. 311 and 313) are formed between the first substrate 301 and the first semiconductor 315. As can be understood, the first wafer 300A can be formed by modifying known methods for forming those traditional SOI wafers, for example by replacing the traditional "buried oxide layer" with the second insulator 313 and the first insulator 311. In another example, the first semiconductor 315 can be grown on the second insulator 313 using a seed layer. In yet another example using a "smart cut" method, the second insulator 313 and the first insulator 311 are formed, followed by ion implantation, wafer flipping and bonding, controlled exfoliation and planarization. Alternatively, the second insulator 313 is formed, followed by ion implantation, formation of the first insulator 311, wafer flipping and bonding, controlled exfoliation and planarization.

FIG. 3B show a cross-sectional view of a second wafer 300B, in accordance with one embodiment of the present disclosure. The second wafer 300B includes a second substrate 303 on a backside of the second wafer 300B, and a second SOI stack 320' on a front side of the second wafer 300B. The second SOI stack 320' includes a third insulator 321, a fourth insulator 323 over the third insulator 321, and a second semiconductor 325 over the fourth insulator 323. The third insulator 321 and the fourth insulator 323 are configured to be etch-selective to each other. Note that the second semiconductor 325 can be single crystalline. The second wafer 300B can be received similar to the first wafer 300A.

In a non-limiting example, the first insulator 311 and the third insulator 321 include a same dielectric while the second insulator 313 and the fourth insulator 323 include another same dielectric. The first insulator 311 and the third insulator 321 can be used to form the dielectric materials 111 and 121. The first semiconductor 315 can be used to form the first channel 115 and the first S/D regions 112. The second semiconductor 325 can be used to form the second channel 125 and the second S/D regions 122. The first substrate 301 corresponds to the substrate 101.

In FIG. 4A, the second insulator 313 is formed over the first semiconductor 315 before a first dielectric layer 331 is formed over the second insulator 313. In FIG. 4B, the fourth insulator 323 is formed over the second semiconductor 325 before a second dielectric layer 333 is formed over the fourth insulator 323.

FIGS. 5-16 show cross-sectional views of a semiconductor device 300C at various intermediate steps of manufacturing, in accordance with some embodiments of the present disclosure. Particularly, the semiconductor device 300C can eventually form the semiconductor device 100A.

Figure 5:
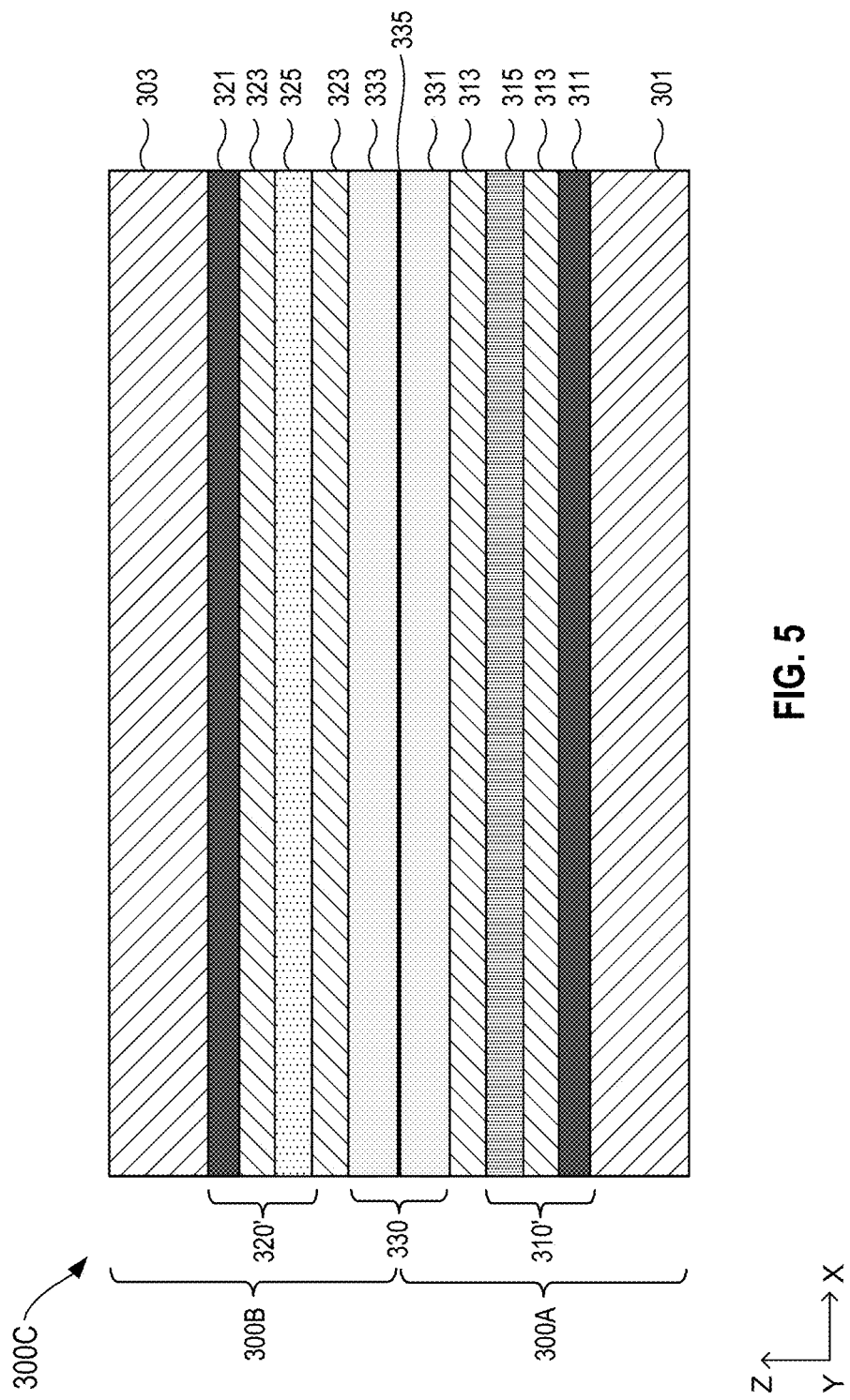
FIGS. 5, 6, 7, 8, 9, 10, 11, 12, 13, 14, 15 and 16 show cross-sectional views of a semiconductor device at various intermediate steps of manufacturing, in accordance with some embodiments of the present disclosure.

In FIG. 5, the second wafer 330B can be flipped and then placed on top of the first wafer 300A. Subsequently, the first wafer 300A and the second wafer 330B can be bonded together (e.g. forming dielectric bond). For instance, a semiconductor device 300C can be formed by forming a bonded wafer by bonding the first dielectric layer 331, which is on the front side of the first wafer 300A, to the second dielectric layer 333, which is on the front side of the second wafer 300B. As a result, an isolation structure 330 is formed that corresponds to the isolation structure 130. The isolation structure 330 may or may not include a bonding interface 335 which corresponds to the bonding interface 135.

In this example, the first dielectric layer 331 and the second dielectric layer 333 include a same dielectric bonding material, such as silicon oxide, and thus can be bonded by fusion bonding. In another example (not shown), the first wafer 300A and the second wafer 330B can be bonded by another wafer bonding technique, such as surface-activated bonding, plasma-activated bonding, anodic bonding, eutectic bonding, glass frit bonding, adhesive bonding, thermocompression bonding, reactive bonding, transient liquid phase diffusion bonding or the like. Accordingly, the first dielectric layer 331 and the second dielectric layer 333 may include one or more different dielectric bonding materials from each other.

Figure 6:
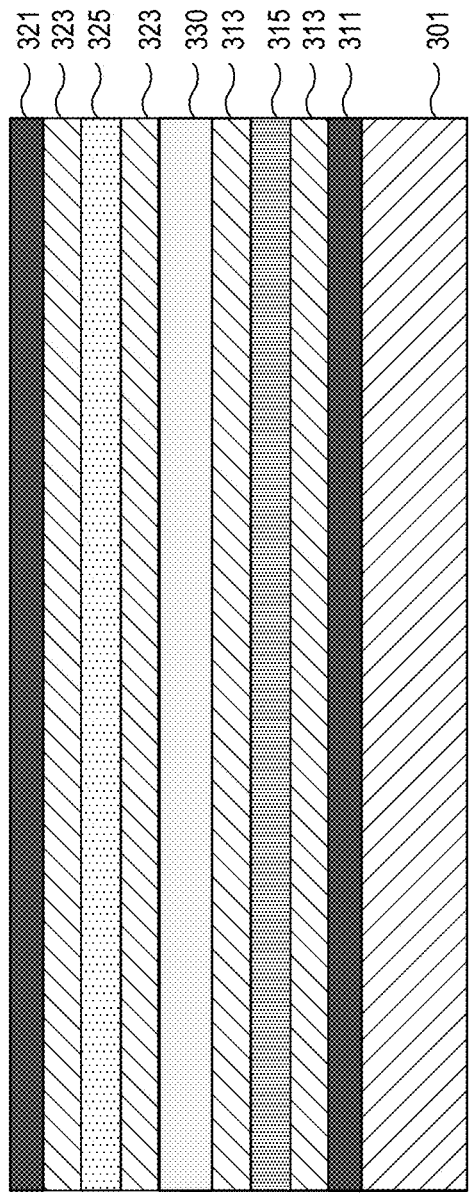

For simplicity purposes, the bonding interface 335 will be omitted from FIGS. 6-15. In FIG. 6, the second substrate 303 is removed, for example by backside grinding or chemical-mechanical polishing (CMP). As a result, the (uppermost) third insulator 321 is exposed at a top in the Z direction. In this example, the first dielectric layer 331, the second dielectric layer 333, the first insulator 311 and the third insulator 321 include a same dielectric material, such as silicon oxide. While not shown, one or more wafers can be stacked over the (uppermost) third insulator 321 by wafer bonding in order to further stack semiconductor in the Z direction. That is, another first wafer 300A in FIG. 4A, another second wafer 300B in FIG. 4B or the like can be bonded to the (uppermost) third insulator 321 in FIG. 6, for example by fusion bonding, before a respective substrate is removed to expose a respective insulator, which can then be further used for wafer bonding. In other words, such a sequence can be repeated for any number of semiconductor nanosheets tall.

Figure 7:
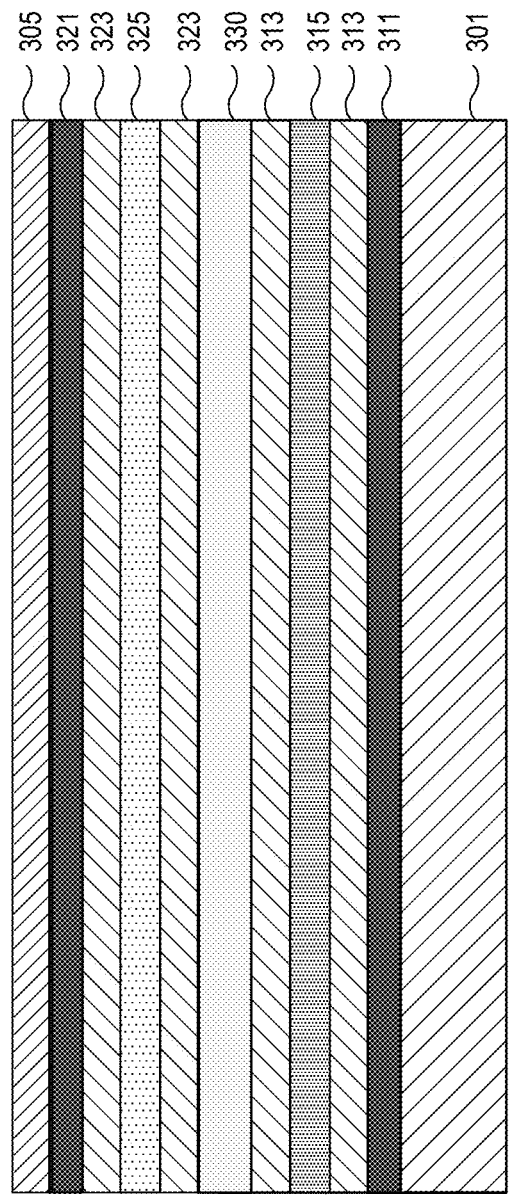

In FIG. 7, a dielectric material 305 can be formed as a capping layer over the (uppermost) third insulator 321. The dielectric material 305 corresponds to the dielectric material 105.

Figure 8:
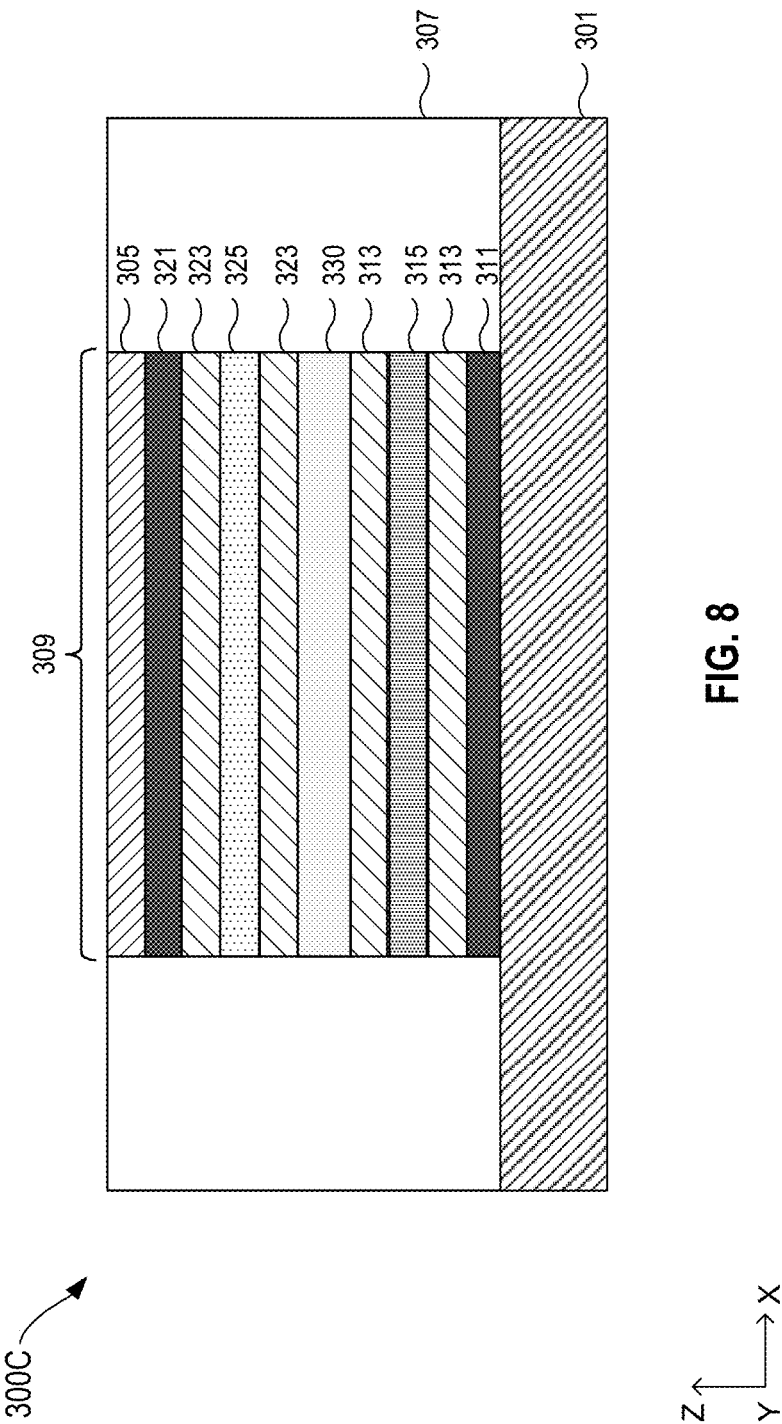

In FIG. 8, the semiconductor device 300C is patterned to form at least one layer stack 309 over the first substrate 301. For example, the bonded wafer can be masked and etched to form the W/L of the horizontal nanosheets, and then photoresist is stripped followed by dielectric deposition and CMP. That is, the at least one layer stack 309 can be formed by directionally etching using a mask. A dielectric material 307 is then deposited and planarized to surround the at least one layer stack 309. The dielectric material 307 corresponds to the dielectric material 107.

Figure 9:
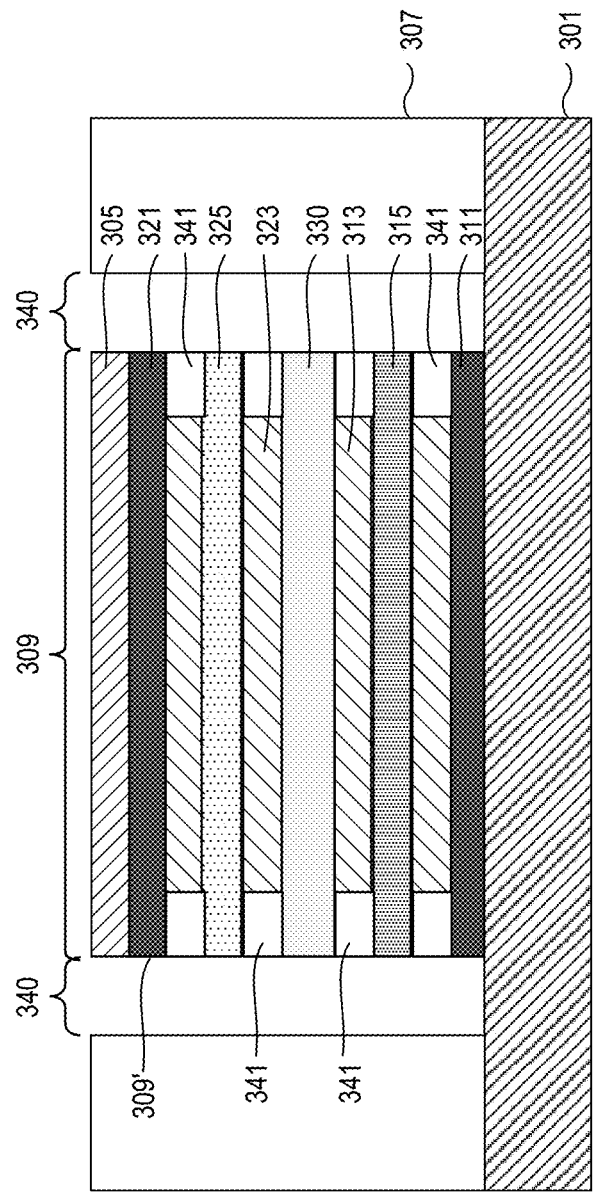

In FIG. 9, opposing sidewalls (e.g. 309') of the at least one layer stack 309 are uncovered by forming openings 340 along the opposing sidewalls (e.g. the −X and +X sides). Then, end portions of insulator layers (e.g. the second insulator 313 and the fourth insulator 323) are replaced with a dielectric material 341 (dielectric spacers). For example, a photoresist mask can be formed to etch the dielectric material 307 to open up future source/drain (S/D) sides of the horizontal nanosheets as shown. Then, the second insulator 313 and the fourth insulator 323, which include a same dielectric, can be indent-etched to form indentations, before the dielectric material 341 is formed in the indentations and etch-aligned to hard mask (e.g. the dielectric material 305 or the capping layer). Note that the dielectric material 341 corresponds to the dielectric material 141.

Figure 10:
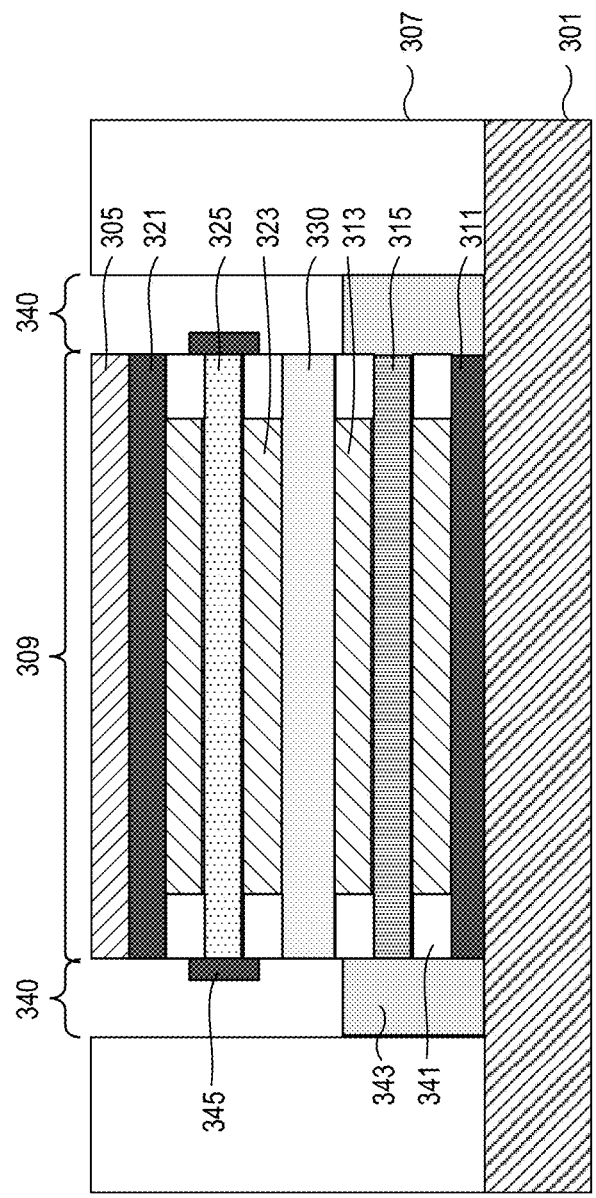
Figure 11:
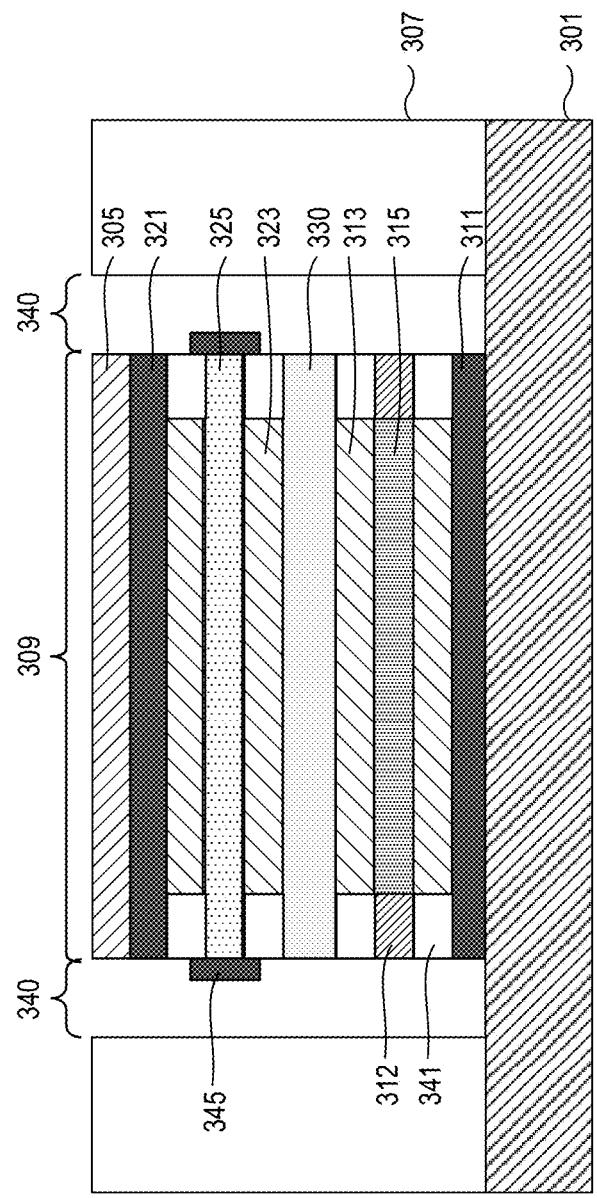

In FIG. 10, a dielectric material 343 is deposited (and etched back) before a dielectric material 345 is formed selectively on exposed ends of the second semiconductor 325 (e.g. Ge). In FIG. 11, the dielectric material 343 is removed, and then the first semiconductor 315 is indent-etched to form indentations, and then first S/D regions 312 are formed in the indentations (e.g. N+ epitaxial growth). As a result, the (remaining) first semiconductor 315 forms a first channel 315 and will hereinafter be referred to as the first channel 315. The first S/D regions 312 correspond to the first S/D regions 112. The first channel 315 corresponds to the first channel 115.

In another embodiment (not shown), formation of the dielectric material 343 may not be needed. For instance, the dielectric material 345 can be formed selectively on exposed ends of the second semiconductor 325 (e.g. Ge) even when ends of the first channel 315 (e.g. Si) are exposed. In yet another embodiment (not shown), formation of the dielectric material 343 and the dielectric material 345 may not be needed. For instance, the first channel 315 (e.g. Si) can be selectively indent-etched to form indentations even when the ends of the second semiconductor 325 (e.g. Ge) are exposed.

Figure 12:
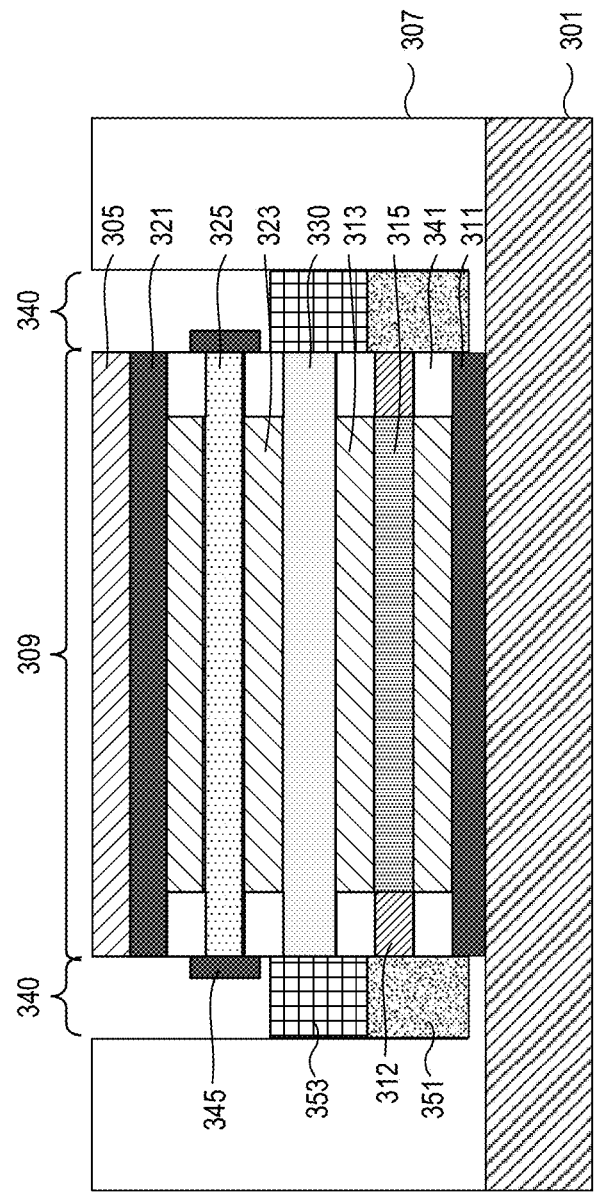

In FIG. 12, vertical conductive structures 351 and middle structures 353 are formed in the openings 340. The vertical conductive structures 351 correspond to the vertical conductive structures 151. The middle structures 353 correspond to the middle structures 153. Note that a dielectric material, such as the dielectric material 307 can be formed between the vertical conductive structures 351 and the first substrate 301.

Figure 13:
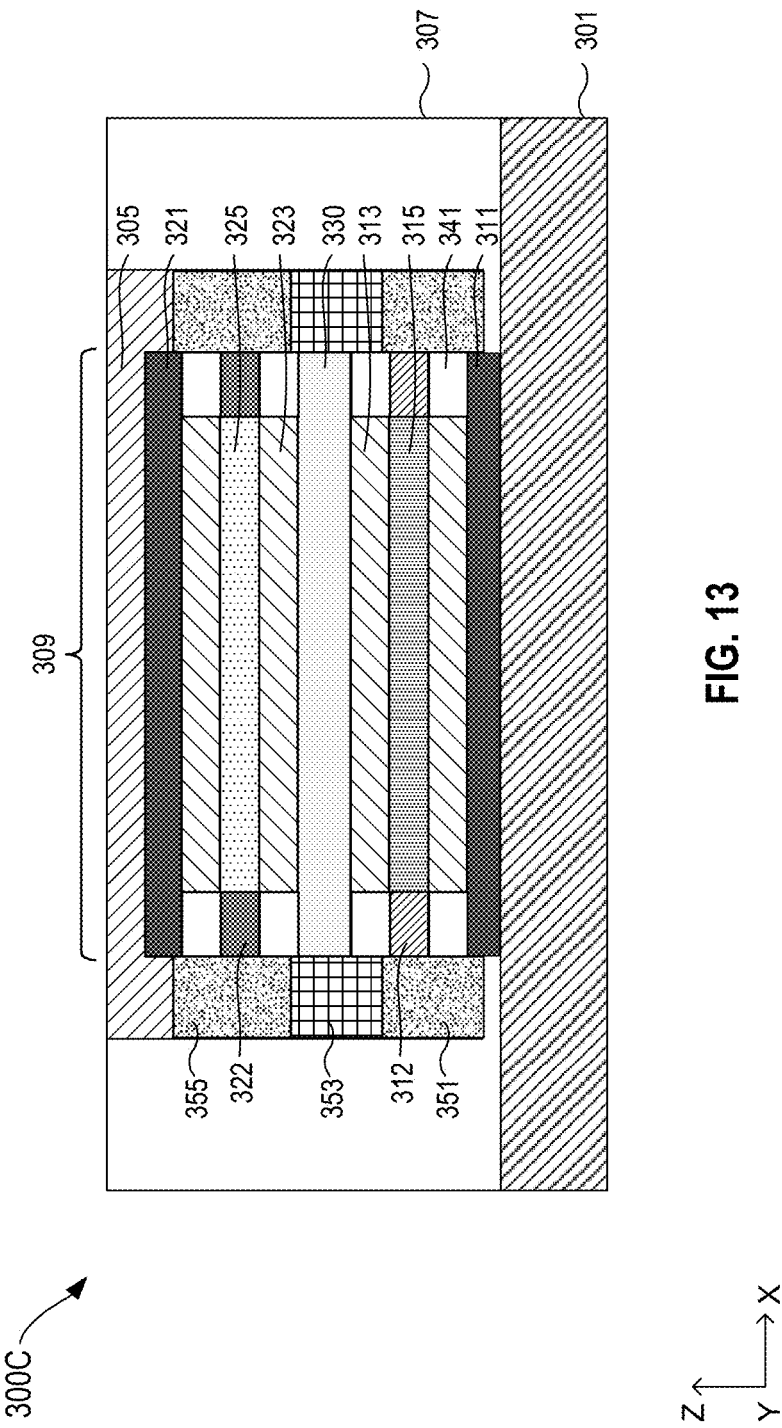

In FIG. 13, the dielectric material 345 is removed to uncover the ends of the second semiconductor 325 (e.g. Ge), followed by indent-etch (e.g. of Ge) to form indentations. As a result, the (remaining) second semiconductor 325 forms a second channel 325 and will hereinafter be referred to as the second channel 325. Then, second S/D regions 322 are formed in the indentations on the ends of the second channel 325 (e.g. P+ epitaxial growth). Subsequently, vertical conductive structures 355 are formed in the openings 340 before the dielectric material 305 is deposited to fill the openings 340 and planarized by CMP. Herein, the second S/D regions 322 correspond to the second S/D regions 122. The vertical conductive structures 355 correspond to the vertical conductive structures 155. The second channel 325 corresponds to the second channel 125.

Figure 14:
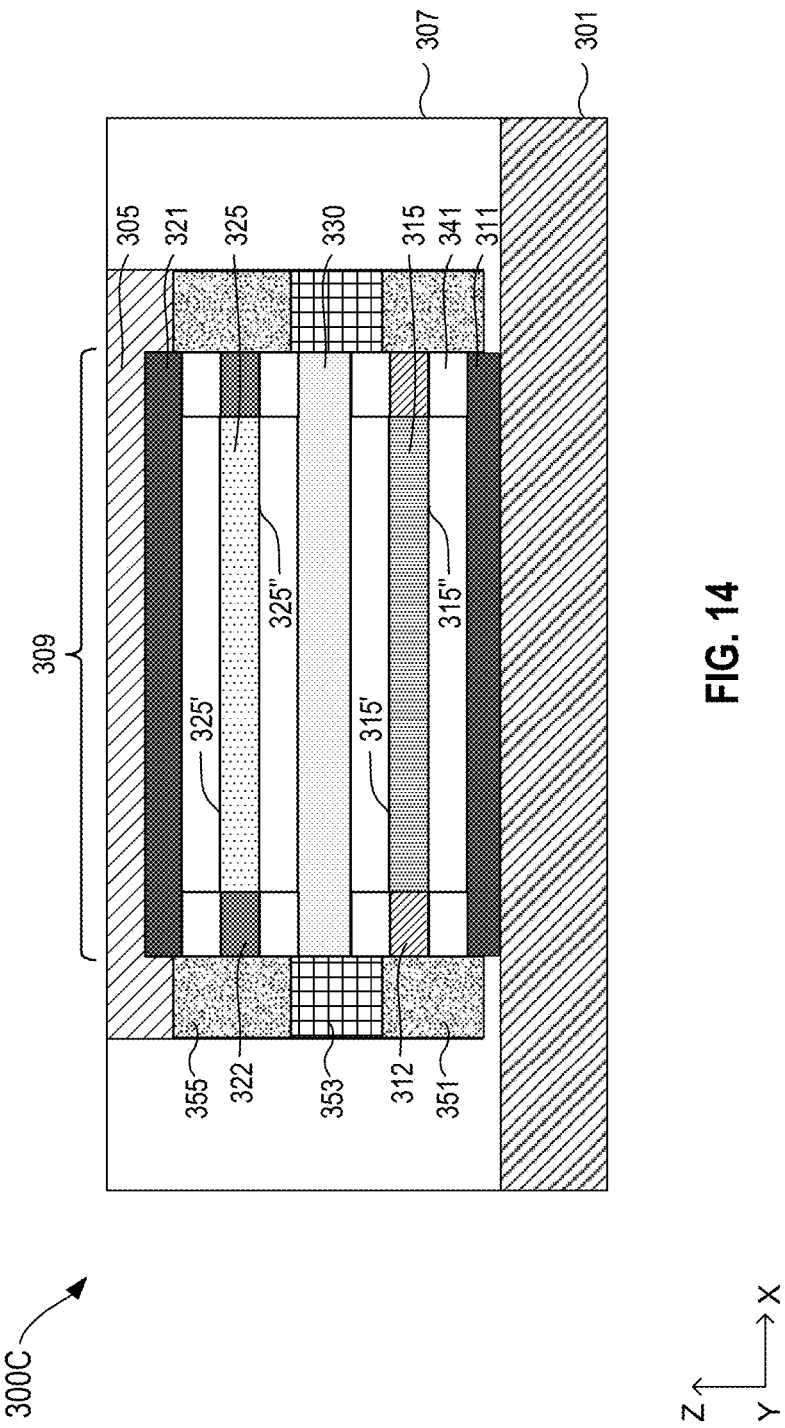

In FIG. 14, the second insulators 313 are removed to uncover top and bottom surfaces (e.g. 315' and 315") of the first channel 315. The fourth insulators 323 are removed to uncover top and bottom surfaces (e.g. 325' and 325") of the second channel 325. For example, this can be accomplished by uncovering opposing sidewalls (e.g. the −Y and +Y sides, not shown) of the at least one layer stack 309. Then, the second insulators 313 and the fourth insulators 323 can be selectively removed.

Figure 15:
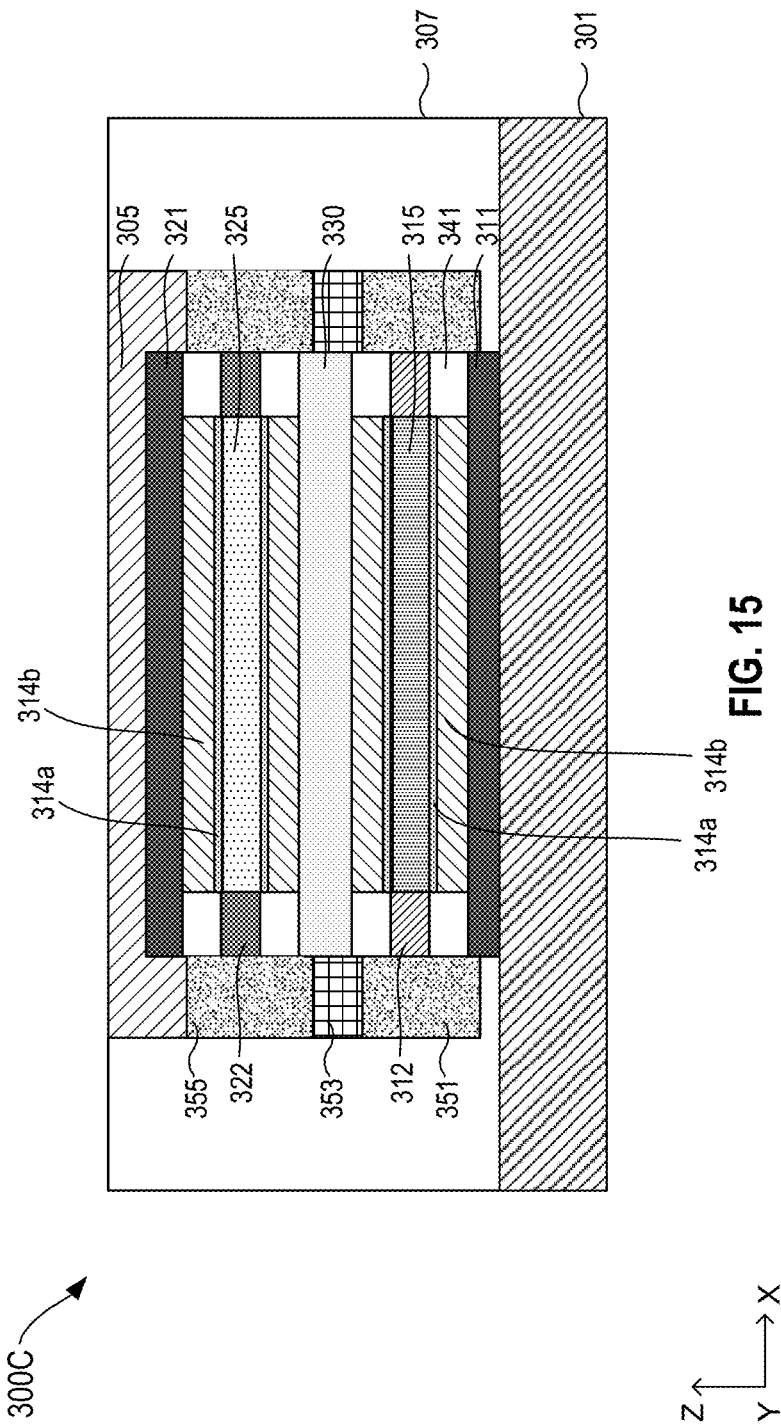

In FIG. 15, at least one gate dielectric 314a (e.g. high K) can be deposited either selectively or non-selectively (selective is shown) on the first channel 315, followed by deposition of at least one gate metal, such as a gate metal 314b (e.g. NMOS gate electrode deposition). As a result, a first gate structure 314 (as shown by 314a and 314b) is formed all around the first channel 315.

While not shown, the first gate structure 314 can be covered by a dielectric material. Excessive gate dielectric 314a and excessive gate metal 314b can be removed from the second channel 325. A dielectric material can be deposited to form isolation between the first gate structure and a future second gate structure. Note that the at least one gate dielectric 314a corresponds to the at least one gate dielectric 114a. The gate metal 314b corresponds to the gate metal 114b. The first gate structure 314 corresponds to the first gate structure 114.

Figure 16:
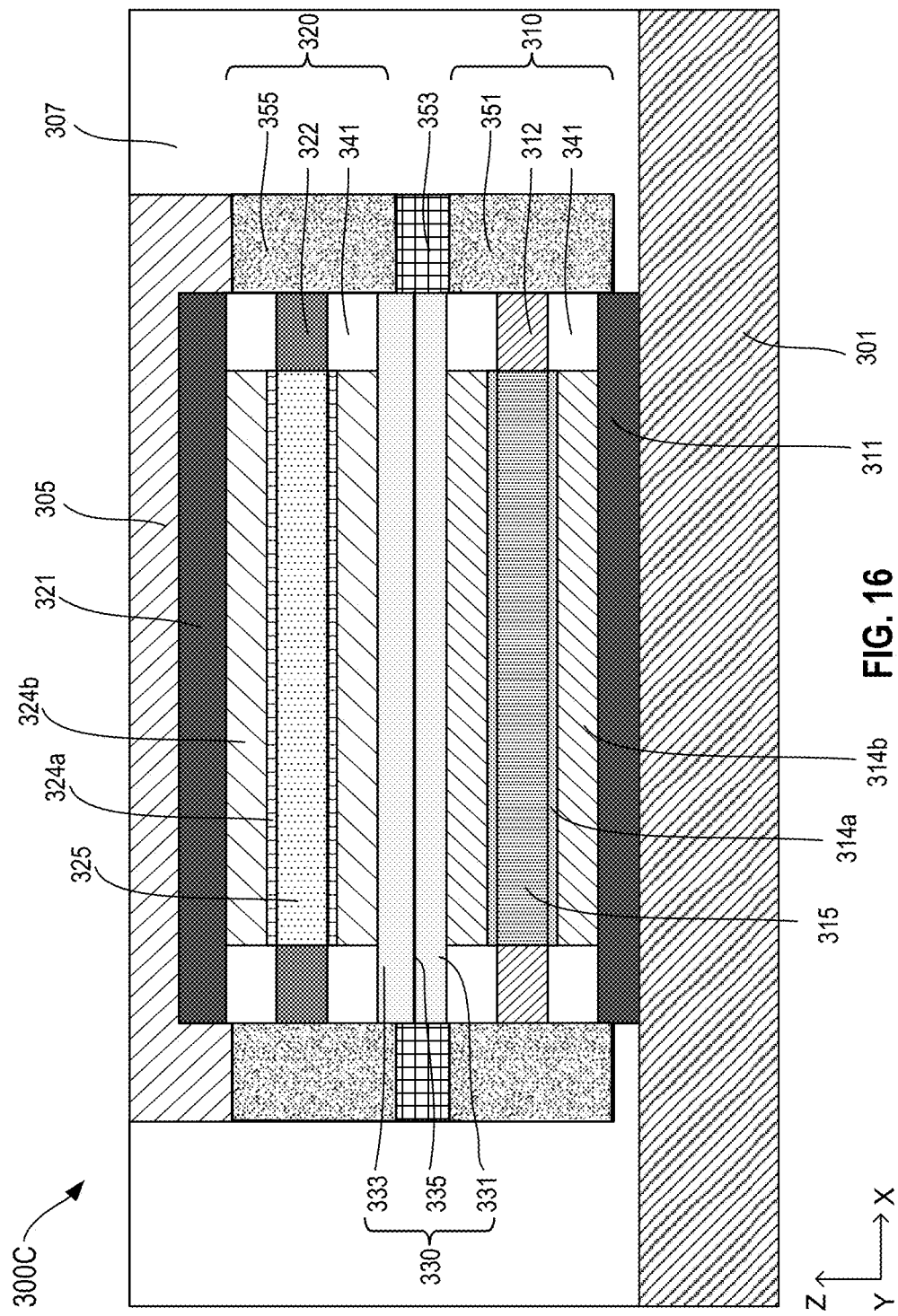

In FIG. 16, at least one gate dielectric 324a (e.g. high K) can be deposited either selectively or non-selectively (selective is shown) on the second channel 325, followed by deposition of at least one gate metal, such as a gate metal 324b (e.g. PMOS gate electrode deposition). As a result, a second gate structure 324 (as shown by 324a and 324b) is formed all around the second channel 325. Note that the at least one gate dielectric 324a corresponds to the at least one gate dielectric 124a. The gate metal 324b corresponds to the gate metal 124b. The second gate structure 324 corresponds to the second gate structure 124. Therefore, the semiconductor device 300C in FIG. 16 corresponds to the semiconductor device 100A in FIG. 1A. In some embodiments, FIG. 16 shows a cross section of a CFET including single crystalline 3D nanosheets (e.g. 315 and 325) without epitaxial growth, with sequential bonding using epitaxial Ge (e.g. 325) for PMOS (e.g. 320) and epitaxial Si (e.g. 315) for NMOS (e.g. 310).

Figure 17:
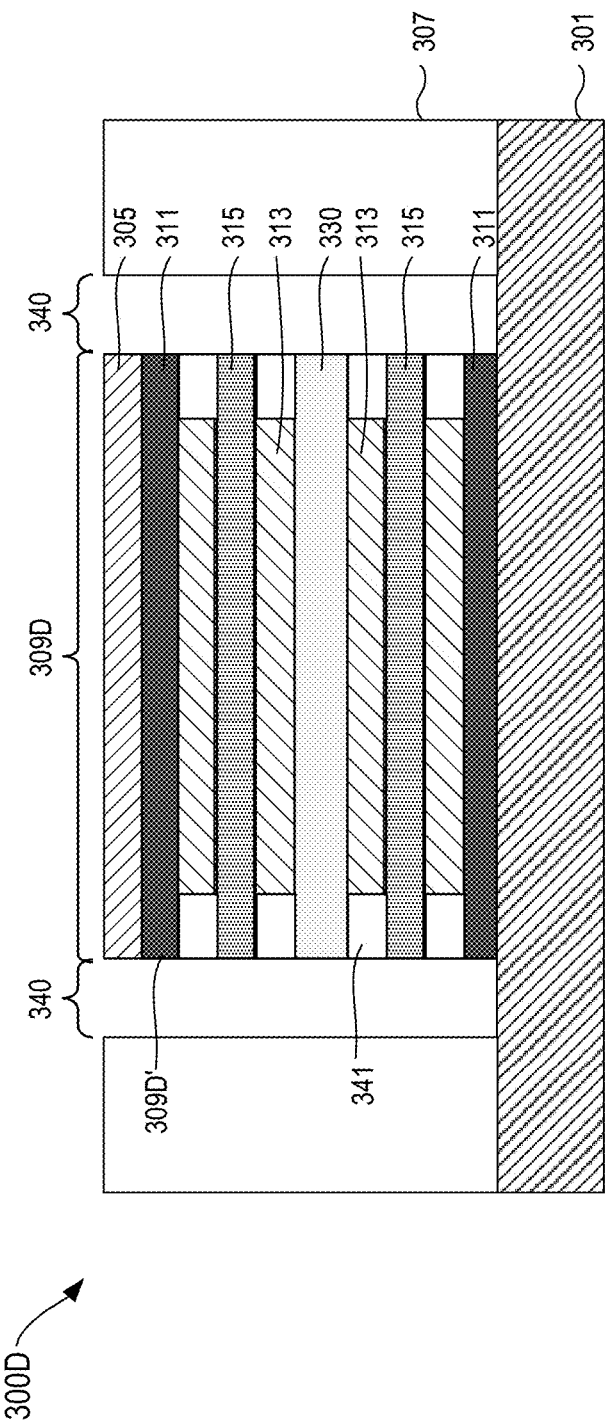
FIGS. 17 and 18 show cross-sectional views of a semiconductor device at various intermediate steps of manufacturing, in accordance with some embodiments of the present disclosure.

FIG. 17 shows a cross-sectional view of a semiconductor device 300D, in accordance with one embodiment of the present disclosure. Since the embodiment of the semiconductor device 300D in FIG. 17 is similar to the embodiment of the semiconductor device 300C in FIG. 9, descriptions herein will be provided with emphasis placed on difference. Note that similar or identical components are labeled with similar or identical numerals unless specified otherwise.

Herein, the semiconductor device 300D includes a layer stack 309D having a plurality of (e.g. two) first semiconductors 315 stacked in the Z direction. Each first semiconductor 315 is positioned between two respective second insulators 313. Accordingly, the semiconductor device 300D can be formed using processes that are similar to what is shown in FIGS. 3A-3B, 4A-4B and 5-9, but first wafers 300A are bonded to each other.

Figure 18:
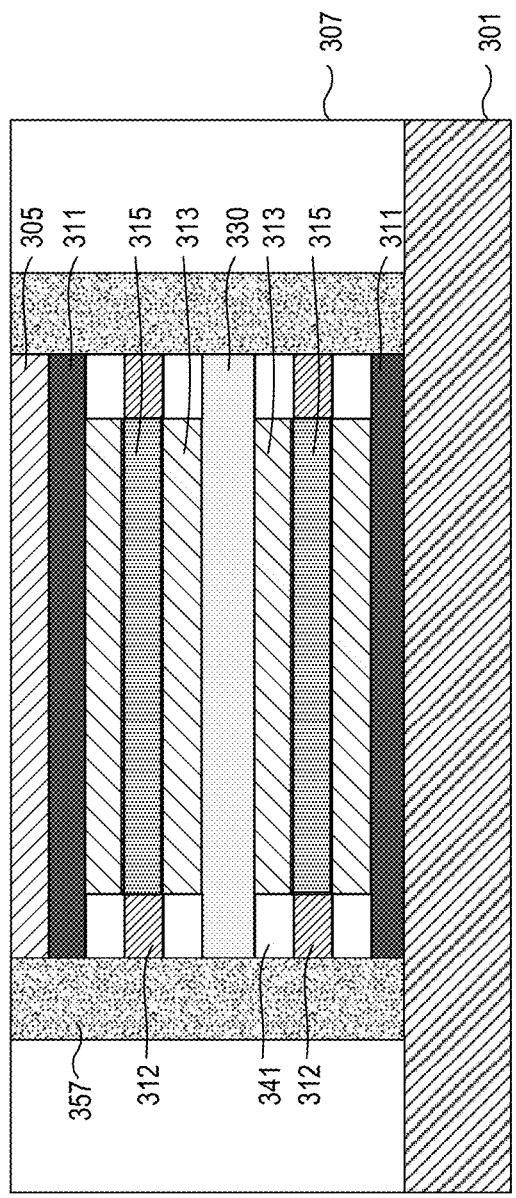

In FIG. 18, first channels 315 are formed by indent-etching, which also forms indentations on ends of the first channels 315. First S/D regions 312 are then formed in the indentations. Common vertical conductive structures 357 are then formed in the openings 340. While not shown, a dielectric material (e.g. the dielectric material 307) can be formed as electrical isolation between the first substrate 301 and the common vertical conductive structures 357). Note that the common vertical conductive structures 357 correspond to the common vertical conductive structures 157.

While not shown, first gate structures, which correspond to the first gate structures 114, can be formed around the first channels 315, for example by removing the second insulators 313 and forming corresponding gate dielectric(s) and gate metal(s). As a result, a stack of transistors, which corresponds to the first stack of transistors in FIG. 1B, can be formed. Similarly, the second stack of transistors in FIG. 1B can be formed. Note that in order to form a plurality of stacks of transistors, one or more layer stacks can be protected, for example by a photoresist mask, while another layer stack(s) is used to form a respective stack of transistors.

Techniques herein include forming a semiconductor-on-metal-insulator-semiconductor (SOMIS) wafer, such as a silicon-on-metal-insulator-silicon wafer, by utilizing in-situ stack of single crystalline silicon for each of nanosheet formation and optimum process flow that contains all device elements needed for 3D stacking. By integration of SOMIS, a stream lined process flows can be achieved for 3D logic and memory devices. High performance devices can be achieved with single crystal silicon. 3D SOMIS provides built-in isolation between devices and a substrate. Any work function metal can be utilized due to a novel process flow for NMOS and PMOS devices. Various single crystal channel materials and doping types can be used for techniques herein.

Techniques herein include forming one or more (metal-insulator-semiconductor-insulator-metal) MISIM stacks. A MISIM stack can include, sequentially in a vertical direction, a gate metal, a gate dielectric, a semiconductor (e.g. channel material), another gate dielectrics and another gate metal. Therefore, the MISIM stack can be used to form at least one gate-all-around (GAA) transistor. The MISIM stack can be formed by wafer bonding. For example, a semiconductor-on-insulator wafer can be bonded to a wafer including a gate metal and a gate dielectric. As a result, the semiconductor of the MISIM stack can be single crystalline.

Figure 19A:
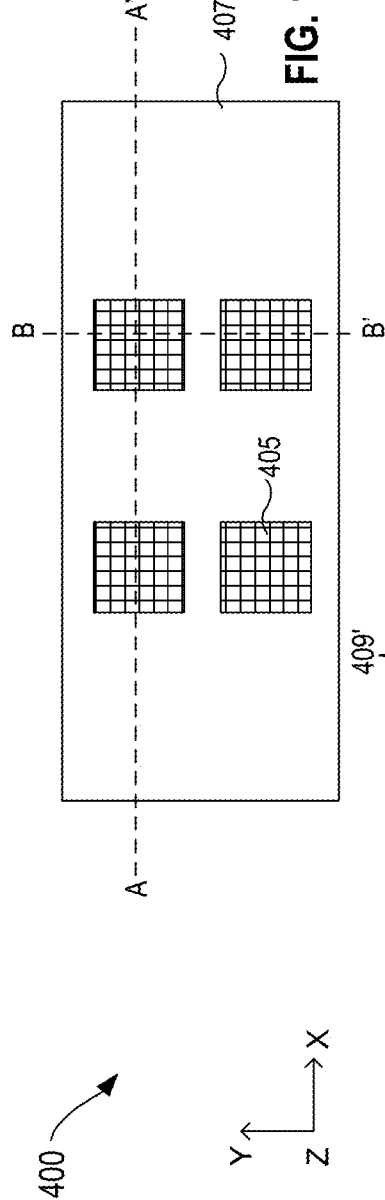
FIG. 19A shows a top view of a semiconductor device in accordance with one embodiment of the present disclosure.
Figure 19B:
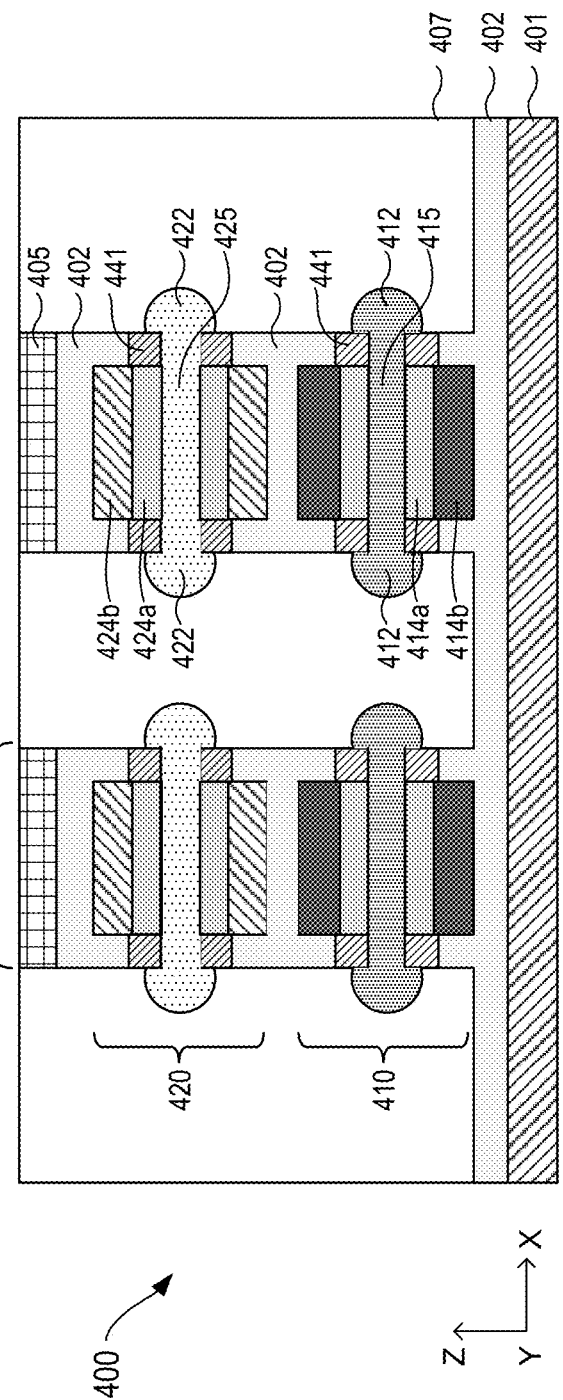
FIG. 19B shows a vertical cross-sectional view taken along the line cut AA' in accordance with one embodiment of the present disclosure.
Figure 19C:
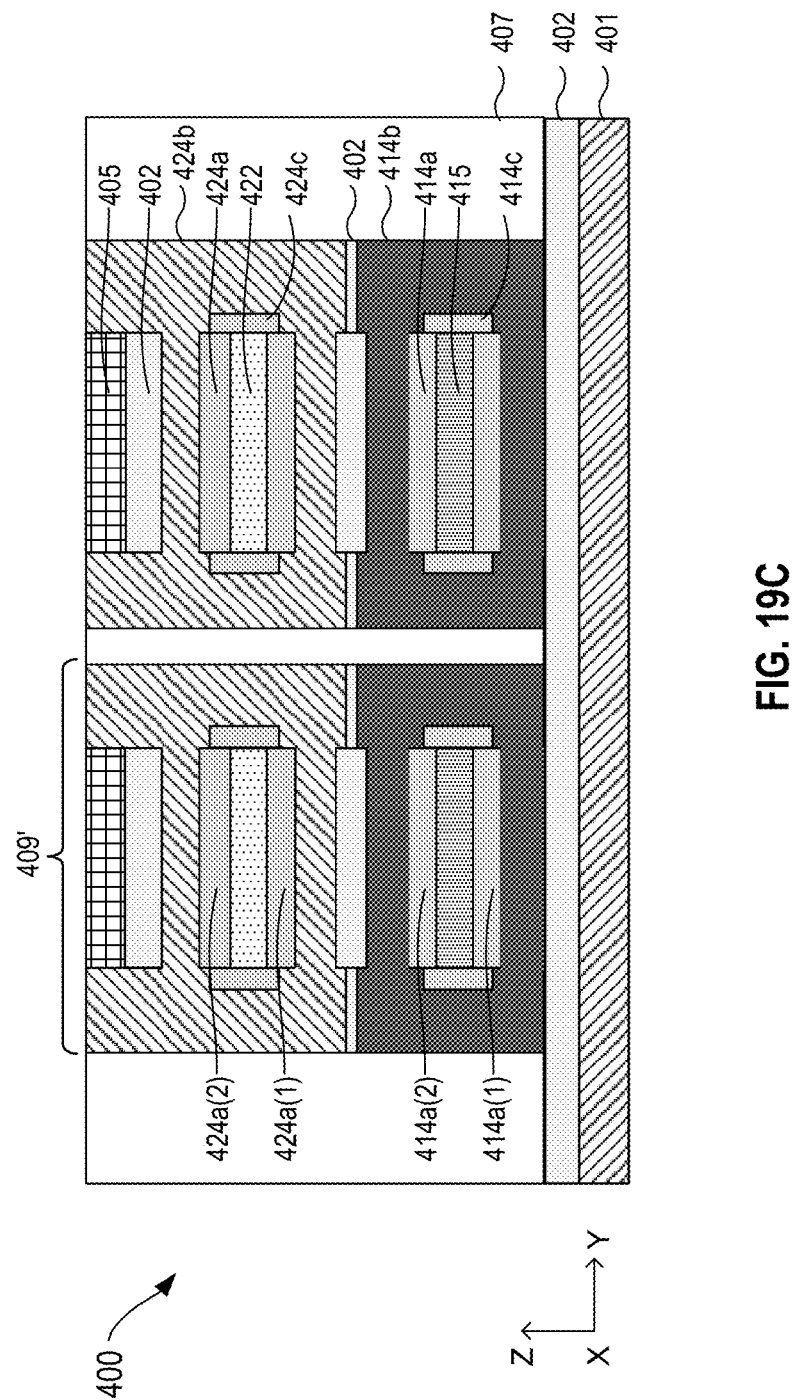
FIG. 19C shows a vertical cross-sectional view taken along the line cut BB' in accordance with one embodiment of the present disclosure.

FIG. 19A shows a top view of a semiconductor device 400 in accordance with one embodiment of the present disclosure. FIGS. 19B and 19C respectively show vertical cross-sectional views taken along the line cuts AA' and BB' in accordance with some embodiments of the present disclosure. As illustrated, the semiconductor device 400 includes a substrate 401 and a plurality of stacks 409' of transistors (e.g. 410 and 420) positioned over the substrate 401.

In a non-limiting example, a stack 409' includes a first transistor 410 and a second transistor 420 stacked over the first transistor 410. Specifically, the first transistor 410 includes a first channel 415, first S/D regions 412 and a first gate structure 414 (as shown by 414a, 414b and 414c) while the second transistor 420 includes a second channel 425, second S/D regions 422 and a second gate structure 424 (as shown by 424a, 424b and 424c). Since the first transistor 410 is similar to the second transistor 420, consider the first transistor 410 for example. In the example of FIG. 19A, the first S/D regions 412 are positioned on opposing ends of the first channel 415. During operation, a current is configured to flow from one of the first S/D regions 412 to the other one of the first S/D regions 412, for example in the X direction.

In some embodiments, gate structures (e.g. 414 and 424) each include at least one gate metal (e.g. 414b and 424b), such as a work function metal (WFM), and at least one gate dielectric (e.g. 414a, 414c, 424a and 424c), such as a high-k dielectric. As can be appreciated, the gate metals 414b and 424b which function as the gate conductors may be the same as or different from each other, and the gate dielectrics 414a, 414c, 424a and 424c may also be the same as or different from each other, depending on a respective channel (i.e. 415 and 425), design requirements (e.g. gate threshold voltage), etc. Note that the gate metal 414b is disposed all around the first channel 415 while the gate metal 424b is disposed all around the second channel 425. Therefore in this example, the first transistor 410 and the second transistor 420 are each a GAA single-channel transistor. While the gate metal 414b and 424b are both shown as a single material, the gate metal 414b and 424b may each be made up of two or more layers of metals having different work functions. Similarly, the gate dielectric 414a, 414c, 424a and 424c may be made up of two or more layers of dielectric materials.

Note that each gate structure may include two respective horizontal gate dielectrics (e.g. 414a(1), 414a(2), 424a(1) and 424a(2)) and two respective vertical gate dielectrics (e.g. 414c and 424c). Consider the first gate structure 414 for example. The first gate structure 414 includes horizontal gate dielectrics 414a, as shown by 414a(1) and 414a(2). In some embodiments, the horizontal gate dielectric 414a(1) can be formed by a wafer bonding process, similar to the isolation structure 130 or 330. Therefore while not shown, the horizontal gate dielectric 414a(1) can include a first high-k dielectric layer bonded to a second high-k dielectric layer, with or without a bonding interface that corresponds to the bonding interface 135 or 335. The horizontal gate dielectric 414a(2) may be formed by deposition without needing wafer bonding. Similarly, a horizontal gate dielectric 424a(1) can also be formed by a wafer bonding process. A horizontal gate dielectric 424a(2) may be formed by deposition without needing wafer bonding.

Note that the first channel 415 and the second channel 425 can include different chemical compositions from one another. That is, the first channel 415 and the second channel 425 can include different semiconductor materials, different dopants and/or different dopant concentration profiles. In one example, the first channel 415 includes n-type silicon while the second channel 425 includes p-type silicon. In another example, the first channel 415 includes p-type silicon while the second channel 425 includes n-type silicon. In yet another example, one of the first channel 415 and the second channel 425 includes silicon while the other one of the first channel 415 and the second channel 425 includes germanium. Alternatively, the first channel 415 and the second channel 425 can include a same chemical composition. For instance, the first channel 415 and the second channel 425 can both include p-doped silicon or both include n-doped silicon.

Further, the first channel 415 can include an element semiconductor or a compound semiconductor. The element semiconductor can include, but is not limited to, Si, Ge, Sn, Se, Te, etc. The compound semiconductor can include GaN, GaAs, InP, InGaN and the like, which can be formed epitaxially. The compound semiconductor can also include a non-epitaxial compound semiconductor that does not need to be formed by epitaxy and may or may not be crystalline. The non-epitaxial compound semiconductor can include an oxide semiconductor or a semiconducting oxide, such as $In_2O_3$, $SnO_2$, InGaZnO, CdO, ZnO, SnO and the like. A non-epitaxial compound semiconductor can also include a metal chalcogenide, such as a transition-metal dichalcogenide (TMDC). A TMDC can have a chemical formula of $MX_2$, where M includes a transition metal from Group VI, Group V or Group VI of the periodic table while X includes a chalcogen such as sulfur (S), selenium (Se) or tellurium (Te). More specifically, a TMDC can include a W-based material (e.g. $WS_2$, $WSe_2$ or $WTe_2$), a Mo-based material (e.g. $MoS_2$, $MoSe_2$ or $MoTe_2$), $HfS_2$, $ZrS_2$, $TiS_2$ or the like. A metal chalcogenide may also include a metal monochalcogenide (e.g. GaSe, InSe or SnS), a metal trichalcogenide (e.g. $TiS_3$) or the like. Similarly, the second channel 425 can independently include an element semiconductor or a compound semiconductor.

Additionally, the first channel 415 and the second channel 425 can be single crystalline, for example each including a single crystal of semiconductor material. Further, the first channel 415 and the second channel 425 can have various shapes or geometry, such as nanosheets.

In some embodiments, the semiconductor device 400 can include dielectric materials, e.g. as shown by 402, 405, 407, 414a, 414c, 424a, 424c and 441. The dielectric materials may also be referred to as isolation structures, isolation layers, diffusion breaks, inner spacers, gate dielectrics, capping layers, etc. depending on functions thereof. For example, the dielectric material 405 can function as and be referred to as a capping layer. Additionally, some of the dielectric materials may include identical materials or may include different materials. For example, the dielectric materials 402 and 407 may include a same dielectric material such as silicon oxide.

In this example, the first S/D regions 412 are epitaxial regions grown on ends of the first channels 415. The first S/D regions 412 and the first channels 415 are respectively doped and thus have junctions between the first S/D regions 412 and the first channels 415. In another example, the first transistor 410 includes a junctionless structure (e.g. shown by 415) and conductive structures (e.g. as shown by 412). While not shown, the junctionless structure (415) can be configured to include an S/D region, a channel region and another S/D region serially connected in the X direction and thus have a current flow path in the X direction. In yet another example, the first transistor 410 includes intrinsic channels (e.g. as shown by 415). Since the first transistor 410 and the second transistor 420 are similar, the above descriptions are also applicable to the second transistor 420.

In the example of FIG. 19A, four stacks 409' of transistors are shown. Of course it should be understood that the semiconductor device 400 can include any number of stacks 409' of transistors arranged in the XY plane over the substrate 401 and separated from each other, for example by the dielectric material 407. Each stack 409' can include any number of transistors stacked in the Z direction.

Figure 20:
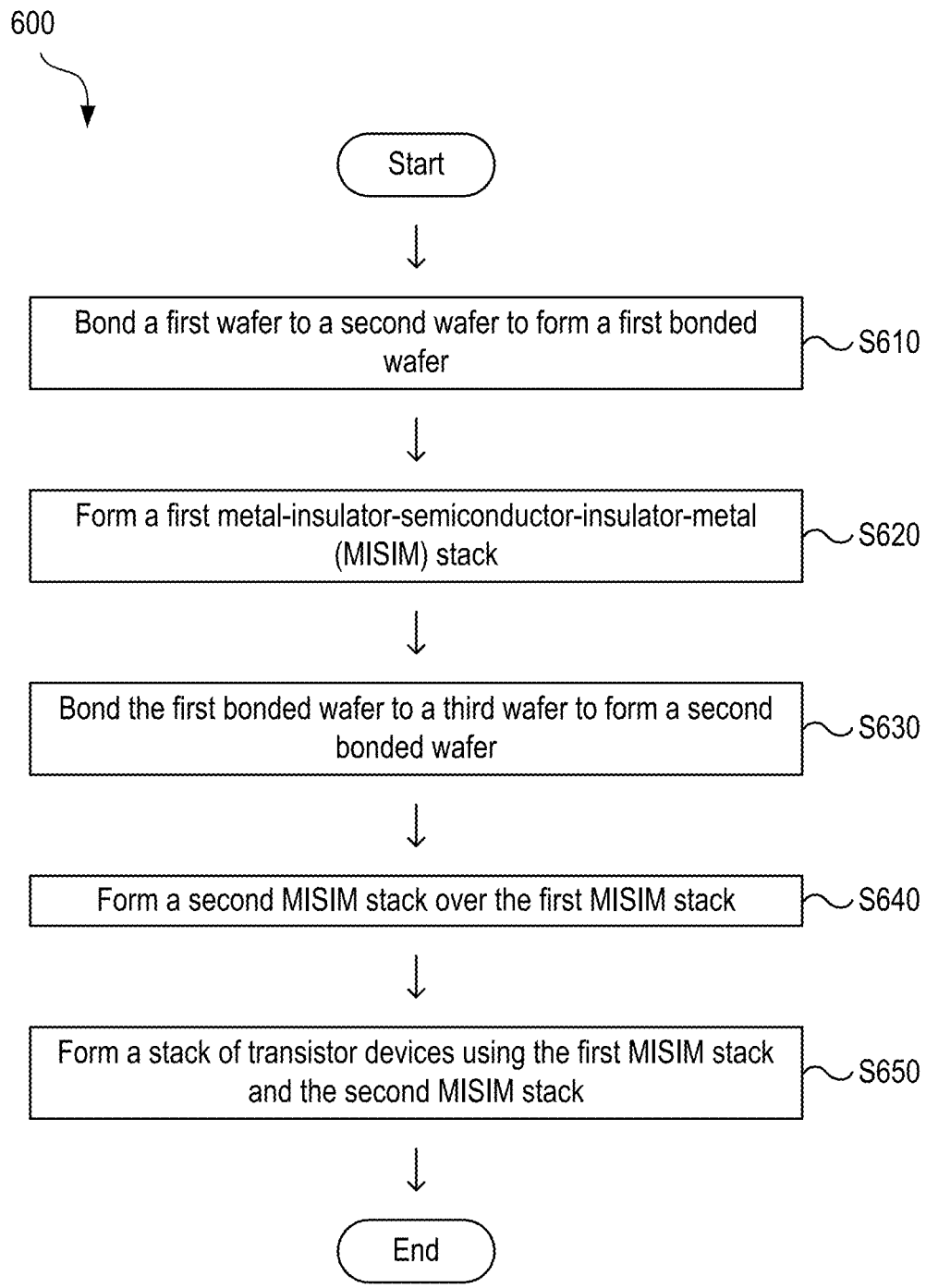
FIG. 20 shows a flow chart of a process for manufacturing a semiconductor device, in accordance with some embodiments of the present disclosure.

FIG. 20 shows a flow chart of a process 600 for manufacturing a semiconductor device, such as the semiconductor device 400 or the like, in accordance with some embodiments of the present disclosure. The process 600 begins with Step S610 by bonding a front side of a first wafer to a front side of a second wafer to form a first bonded wafer. The first wafer includes a first substrate and a first gate metal over the first substrate. The first gate metal is positioned on the front side of the first wafer. The second wafer includes a second substrate, a first gate dielectric over the second substrate and a first semiconductor over the first gate dielectric. The first semiconductor is positioned on the front side of the second wafer. At Step S620, a first metal-insulator-semiconductor-insulator-metal (MISIM) stack is formed on a front side of the first bonded wafer. The first MISIM stack includes, sequentially in a vertical direction, the first gate metal, the first gate dielectric, the first semiconductor, the first gate dielectric and the first gate metal. At Step S630, a front side of the first bonded wafer is bonded to a front side of a third wafer to form a second bonded wafer. The third wafer includes a third substrate, a second gate dielectric over the third substrate and a second semiconductor over the second gate dielectric. The third semiconductor is positioned on the front side of the second wafer. At Step S640, a second MISIM stack is formed over the first MISIM stack. The second MISIM stack includes, sequentially in a vertical direction, a second gate metal, the second gate dielectric, the second semiconductor, the second gate dielectric and the second gate metal. At Step S650, a stack of transistor devices is formed by using the first MISIM stack to form a first transistor and using the second MISIM stack to form a second transistor.

Figure 21A:
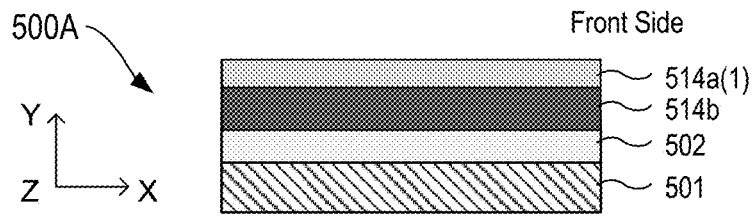
FIG. 21A shows a cross-sectional view of a first wafer in accordance with some embodiments of the present disclosure.

FIG. 21A shows a cross-sectional view of a first wafer 500A in accordance with some embodiments of the present disclosure. As illustrated, the first wafer 500A includes a first substrate 501 and a first gate metal 514b over the first substrate 501. A dielectric material 502 is positioned between the first gate metal 514b and the first substrate 501. A first gate dielectric 514a(1) can be formed over the first gate metal 514b. The first substrate 501 is positioned on a backside of the first wafer 500A. The first gate metal 514b and the first gate dielectric 514a(1) are positioned on a front side of the first wafer 500A.

Figure 21B:
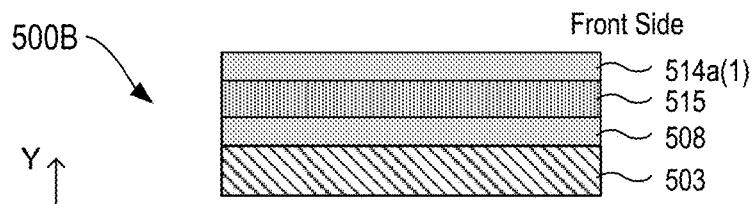
FIG. 21B shows a cross-sectional view of a second wafer in accordance with some embodiments of the present disclosure.

FIG. 21B shows a cross-sectional view of a second wafer 500B in accordance with some embodiments of the present disclosure. As illustrated, the second wafer 500B includes a second substrate 503, a dielectric material 508 over the second substrate 503 and a first semiconductor 515 over the dielectric material 508. The first gate dielectric 514a(1) can be formed over the first semiconductor 515. The second substrate 503 is positioned on a backside of the second wafer 500B. The first semiconductor 515 and the first gate dielectric 514a(1) are positioned on a front side of the second wafer 500B. Note that the second wafer 500B can be a semiconductor-on-insulator wafer, and thus the first semiconductor 515 can be single-crystalline.

Figure 21C:
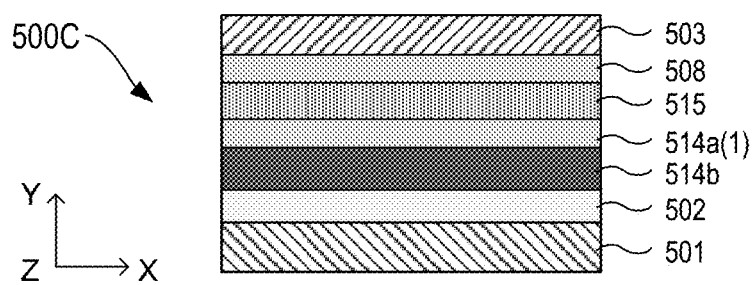
FIGS. 21C, 21D and 21E show cross-sectional views of a first bonded wafer at various intermediate steps of manufacturing, in accordance with some embodiments of the present disclosure.

In FIG. 21C, the front side of the first wafer 500A is bonded to the front side of the second wafer 500B to form a first bonded wafer 500C, by bonding the first gate dielectrics 514a(1). Descriptions regarding wafer bonding have been provided above and will be omitted herein for simplicity purposes.

Figure 21D:
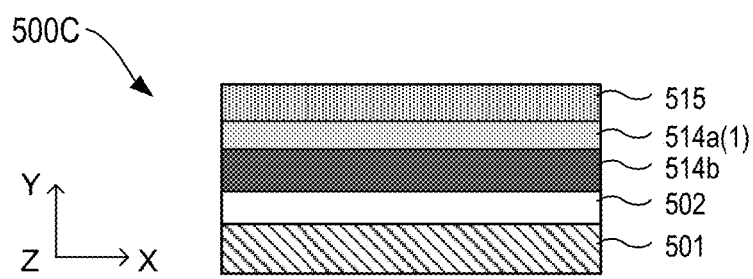

In FIG. 21D, the second substrate 503 is removed by back grinding or CMP. The dielectric material 508 (e.g. silicon oxide) is also removed. As a result, a semiconductor-on-metal-insulator-semiconductor (SOMIS) wafer is formed. In this example, the first semiconductor 515 and the first substrate both include silicon. Thus, the first bonded wafer 500C is a silicon-on-metal-insulator-silicon (515-on-514b-502-501) wafer.

Figure 21E:
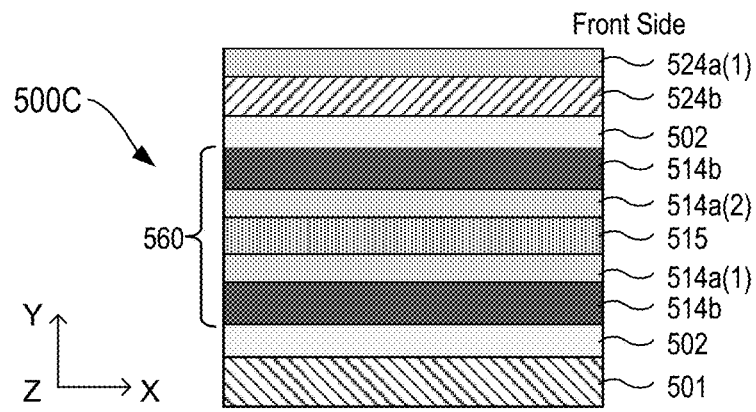

In FIG. 21E, the first gate dielectric 514a(2) can be optionally formed or deposited over the first semiconductor 515. The first gate metal 514b is formed over the first gate dielectric 514a(2). As a result, a first metal-insulator-semiconductor-insulator-metal (MISIM) stack 560 is formed. Then, the dielectric material 502, a second gate metal 524b and a second gate dielectric 524a(1) can be sequentially formed over the first MISIM stack 560. The second substrate 503 is positioned on a backside of the first bonded wafer 500C. The second gate dielectric 524a(1) is positioned on a front side of the first bonded wafer 500C.

Figure 21F:
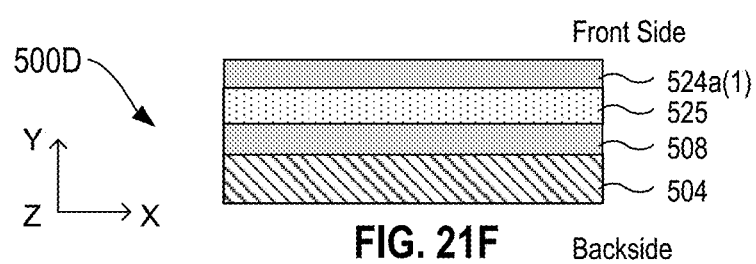
FIG. 21F shows a cross-sectional view of a third wafer in accordance with some embodiments of the present disclosure.

FIG. 21F shows a cross-sectional view of a third wafer 500D in accordance with some embodiments of the present disclosure. As illustrated, the third wafer 500D includes a third substrate 504, the dielectric material 508 over the third substrate 504 and a second semiconductor 525 over the dielectric material 508. The second gate dielectric 524a(1) can be formed over the first semiconductor 515. The third substrate 504 is positioned on a backside of the third wafer 500D. The second semiconductor 525 and the second gate dielectric 524a(1) are positioned on a front side of the third wafer 500D. Note that the third wafer 500D can be a semiconductor-on-insulator wafer, and thus the second semiconductor 525 can be single-crystalline.

Figure 21G:
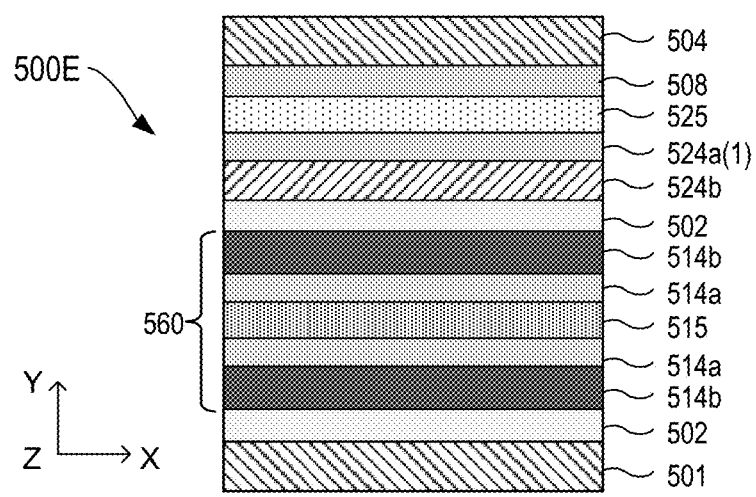
FIGS. 21G and 21H show cross-sectional views of a second bonded wafer at various intermediate steps of manufacturing, in accordance with some embodiments of the present disclosure.

In FIG. 21G, the front side of the first bonded wafer 500C is bonded to the front side of the third wafer 500D to form a second bonded wafer 500E, by bonding the second gate dielectrics 524a(1).

Figure 21H:
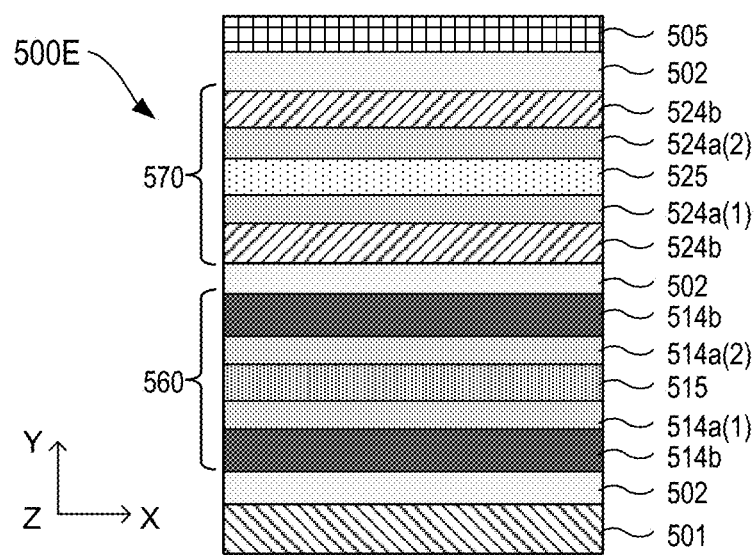

In FIG. 21H, the third substrate 504 is removed by back grinding or CMP. The dielectric material 508 is also removed. The second gate dielectric 524a(2) is then formed. Then, the second gate metal 524b can be formed. As a result, a second MISIM stack 570 is formed. Subsequently, the dielectric material 502 and a capping layer 505 can be sequentially formed over the second MISIM stack 570.

In some embodiments, the first substrate 501 corresponds to the substrate 401. The dielectric material 502 corresponds to the dielectric material 402. The second semiconductor 525 corresponds to the second semiconductor 425. The capping layer 505 corresponds to the dielectric material 405. The first MISIM stack 560 can be used to form one or more first transistors 410. The second MISIM stack 570 can be used to form one or more second transistors 420. Accordingly, the first gate metal 514b can be used to form the gate metal 414b. The first gate dielectrics 514a(1) and 514a(2) can respectively be used to form the horizontal gate dielectrics 414a(1) and 414a(2). The first semiconductor 515 can be used to form the first channels 415. The second semiconductor 525 can be used to form the second channels 425. The second gate metal 524b can be used to form the gate metal 424b. The second gate dielectrics 524a(1) and 524a(2) can respectively be used to form the horizontal gate dielectrics 424a(1) and 424a(2).

Note that two MISIM stacks (i.e. 560 and 570) are shown for illustrative purposes. It should be understood that more MISIM stack(s) can be further stacked by repeating the processes demonstrated herein. In the examples of FIG. 21A-21H, the first gate dielectrics 514a(1) and 514a(2) include a same dielectric material, such as a high-k dielectric. The second gate dielectrics 524a(1) and 524a(2) include a same dielectric material, such as a high-k dielectric. The first gate dielectric 514a(1) and the second gate dielectrics 524a(1) are used for wafer bonding. In other embodiments (not shown), other material(s) and/or other bonding techniques can be used.

Figure 22A:
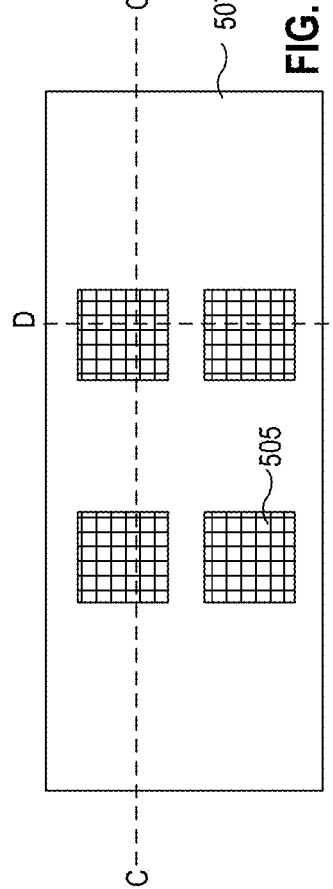
FIG. 22A shows a top view of a semiconductor device in accordance with one embodiment of the present disclosure.

Note that FIGS. 21A-21H, 22A-22B and 23-27 are not drawn to scale. The second bonded wafer 500E will be referred to as a semiconductor device 500E hereinafter. FIG. 22A shows a top view of the semiconductor device 500E, and FIG. 22B shows a vertical cross-sectional view taken along the line cut CC' in accordance with some embodiments of the present disclosure.

Figure 22B:
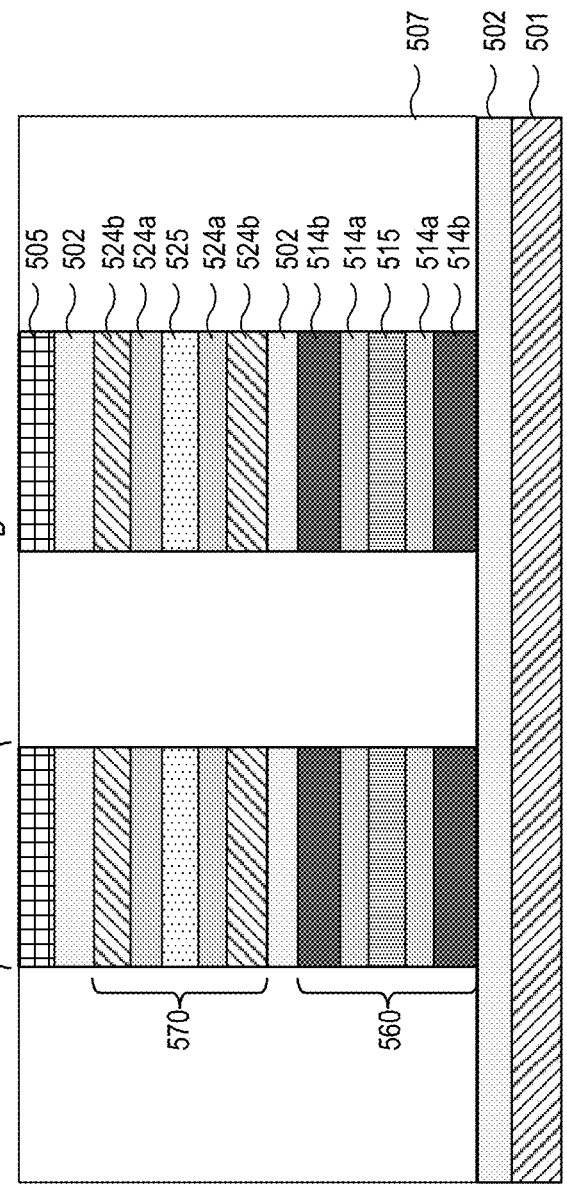
FIG. 22B shows a vertical cross-sectional view taken along the line cut CC' in accordance with one embodiment of the present disclosure.

In FIGS. 22A and 22B, a directional etching process is performed to divide the first MISIM stack 560 and the second MISIM stack 570 in the XY plane to form independent layer stacks 509 (or W/L segments). A dielectric material 507 (e.g. isolation dielectric) which correspond to the dielectric material 407 is formed to surround the layer stacks 509 and planarized by CMP. As a result, first channels 515 which correspond to the first channels 415 are formed, and the first semiconductor 515 will be referred to as the first channels 515 hereinafter. Second channels 525 which correspond to the second channels 425 are formed, and the second semiconductor 525 will be referred to as the second channels 525 hereinafter.

Figure 23:
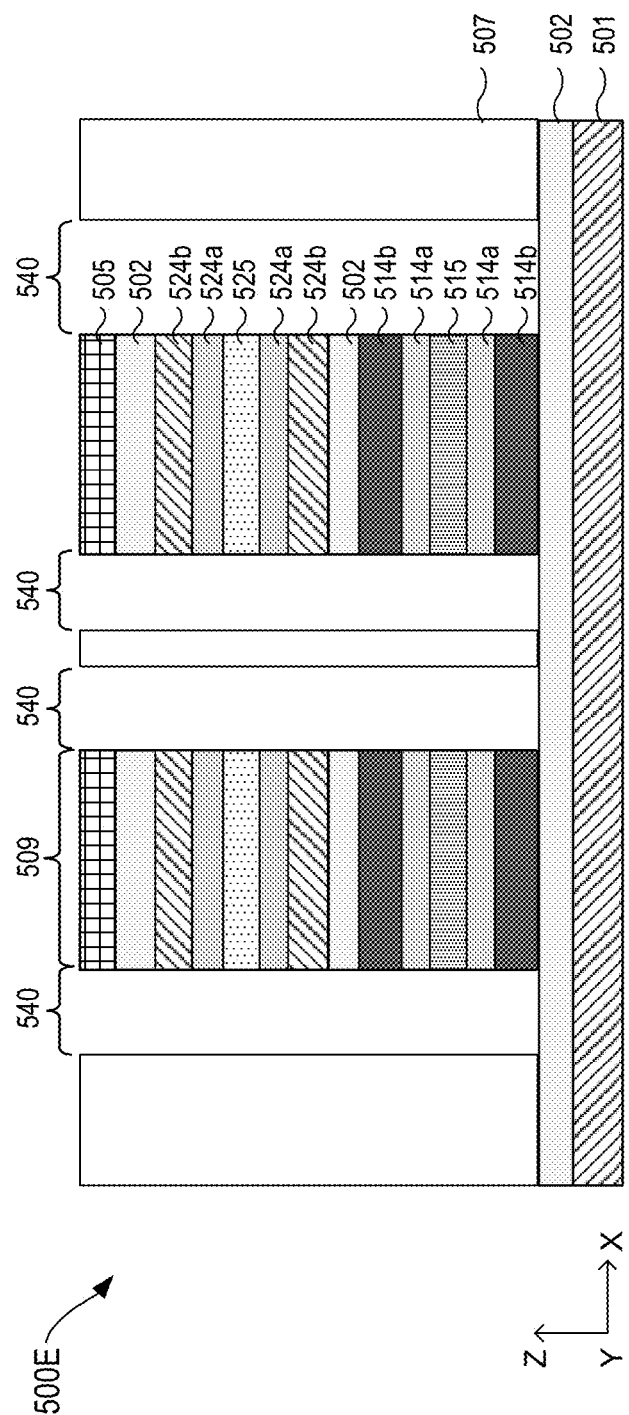
FIGS. 23, 24, 25, 26 and 27 show cross-sectional views of a semiconductor device at various intermediate steps of manufacturing, in accordance with some embodiments of the present disclosure.

In FIG. 23, first openings 540 are formed to uncover the layer stacks 509 from opposing sides (e.g. the −X and +X sides) to open up future source/drain (S/D) sides.

Figure 24:
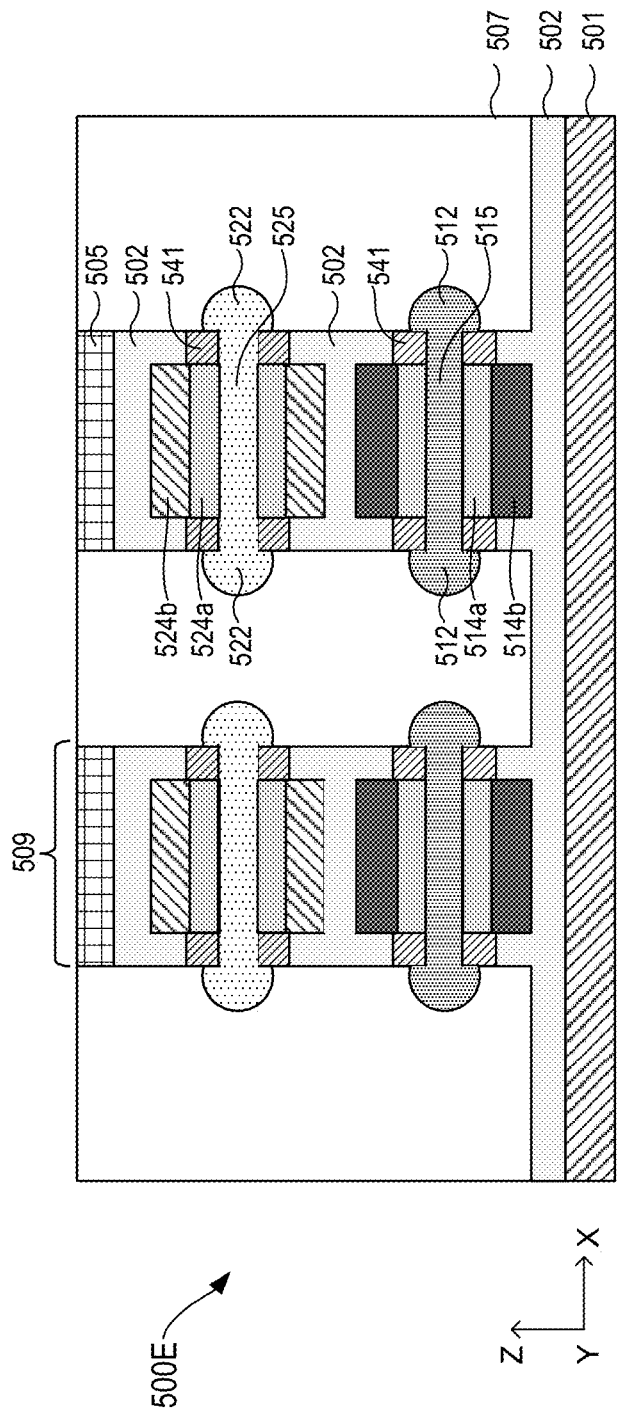

In FIG. 24, the first gate dielectrics 514a and the second gate dielectrics 524a can be dent-etched to form indentations so that dielectric spacers 541 can be formed on opposing ends of the first gate dielectrics 514a and the second gate dielectrics 524a. First S/D regions 512 can be formed on opposing ends of the first channels 515, for example by selective deposition and/or epitaxial growth. Second S/D regions 522 can be formed on opposing ends of the second channels 525, for example by selective deposition and/or epitaxial growth. The first gate metals 514b and the second gate metals 524b can also be dent-etched and filled with the dielectric material 502 (e.g. silicon oxide). Then, the first openings 540 are filled with the dielectric material 507. Note that the first S/D regions 512 and the second S/D regions 522 can respectively correspond to the first S/D regions 412 and the second S/D regions 422. In some embodiments, the first S/D regions 512 and the second S/D regions 522 are not epitaxially grown.

Figure 25:
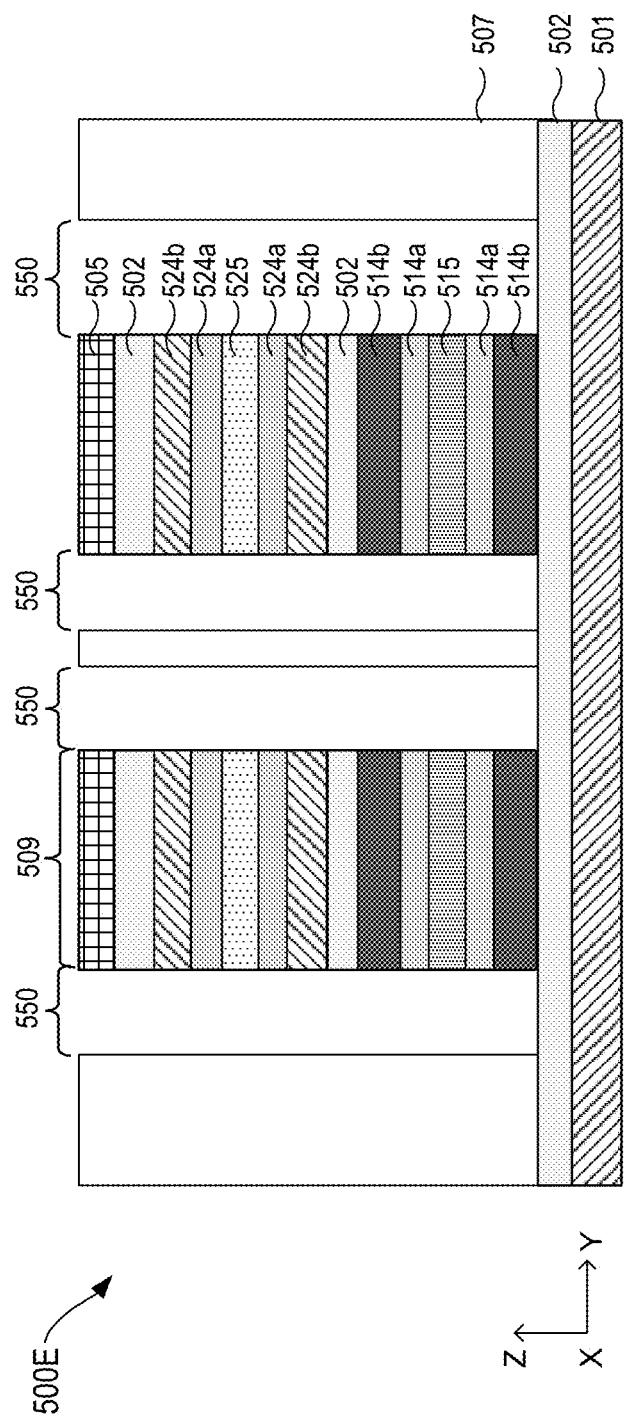

In FIG. 25, second openings 550 are formed to uncover the layer stacks 509 from opposing sides (e.g. the −Y and +Y sides) for future gate formation. Note that the cross section view of FIG. 25 is taken in the YZ plane, for example along the line cut DD' in FIG. 22A.

Figure 26:
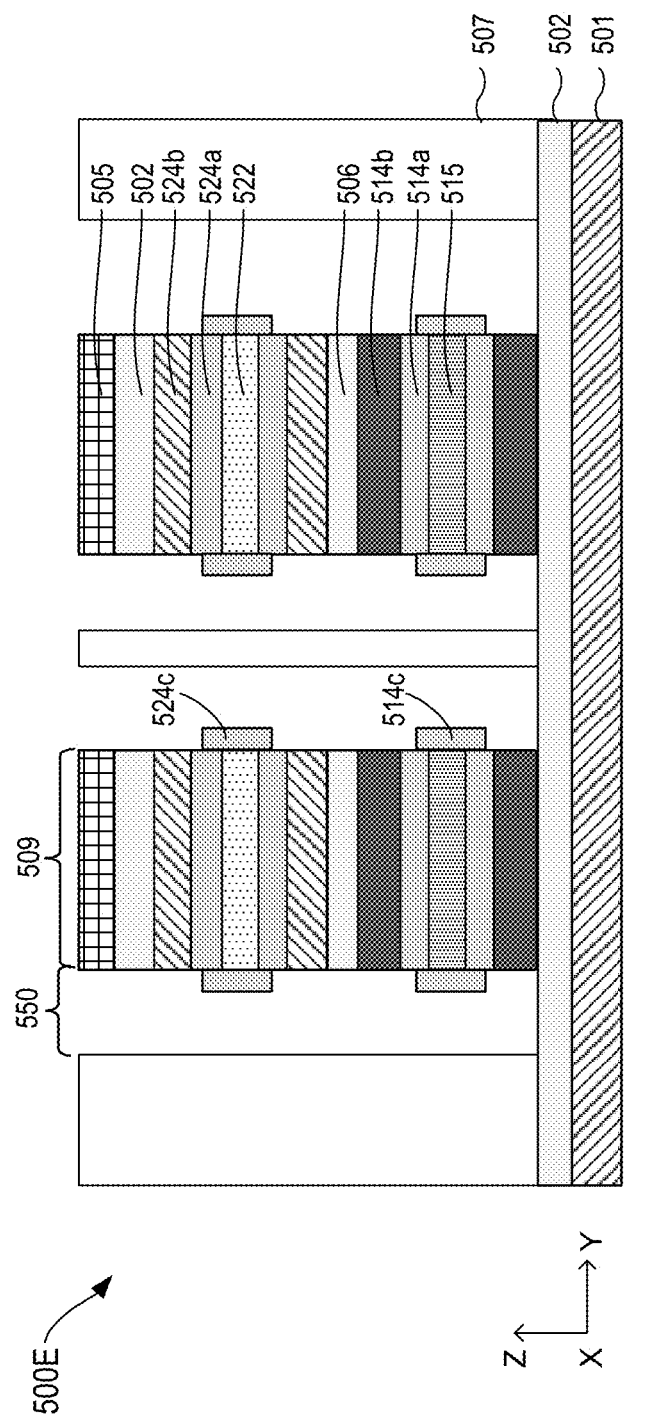

In FIG. 26, vertical gate dielectrics 514c and 524c are respectively formed on opposing ends of the first channels 515 and the second channels 525. The vertical gate dielectrics 514c and 524c can correspond to the (vertical) gate dielectrics 414c and 424c. In this example, the first (horizontal) gate dielectrics 514a and the vertical gate dielectrics 514c include a same material. The second (horizontal) gate dielectrics 524a and the vertical gate dielectrics 524c include a same material.

Figure 27:
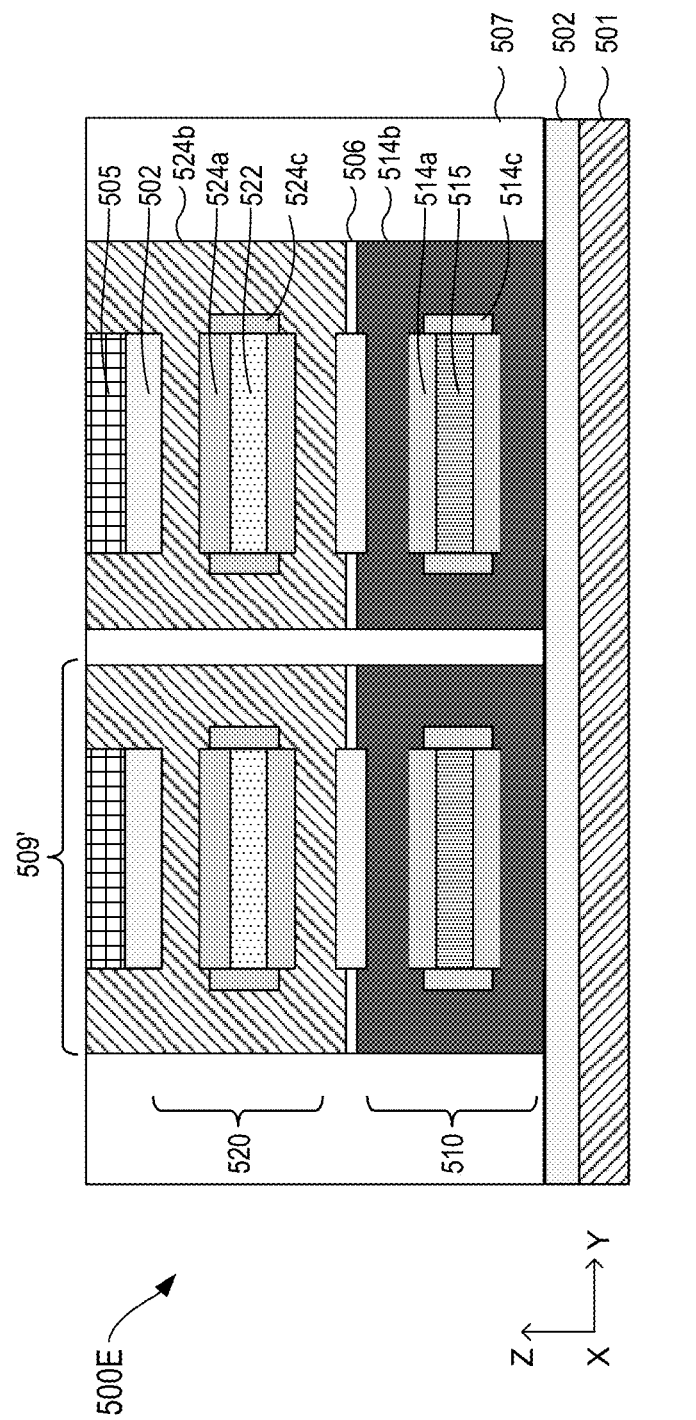

In FIG. 27, the first gate metal 514b, a dielectric material 506 and the second gate metal 524b are formed in the second openings 550. Consequently, stacks 509' of transistors, which correspond to the stacks 409' of transistors, are formed. Specifically, first transistors 510, which correspond to the first transistors 410, are formed. Second transistors 520, which correspond to the second transistors 420, are formed. As a result, the semiconductor device 500E can become the semiconductor device 400. Similar to the first transistor 410 and the second transistor 420 as described above, the first transistor 510 and/or the second transistors 520 can have junctions between respective S/D regions and respective channels, or include junctionless structures, or include intrinsic channels.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "wafer" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

The substrate can be any suitable substrate, such as a silicon (Si) substrate, a germanium (Ge) substrate, a silicon-germanium (SiGe) substrate, and/or a silicon-on-insulator (SOI) substrate. The substrate may include a semiconductor material, for example, a Group IV semiconductor, a Group III-V compound semiconductor, or a Group II-VI oxide semiconductor. The Group IV semiconductor may include Si, Ge, or SiGe. The substrate may be a bulk wafer or an epitaxial layer.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method of fabricating a semiconductor device, the method comprising:
    receiving a first wafer comprising a first substrate on a backside of the first wafer, and a first semiconductor-on-insulator (SOI) stack on a front side of the first wafer, the first SOI stack comprising a first insulator, one layer of a second insulator over the first insulator, and a first semiconductor over the one layer of the second insulator, the first wafer further comprising another layer of the second insulator over the first semiconductor, the first insulator and the second insulator configured to be etch-selective to each other;
    receiving a second wafer comprising a second substrate on a backside of the second wafer, and a second SOI stack on a front side of the second wafer, the second SOI stack comprising a third insulator, one layer of a fourth insulator over the third insulator, and a second semiconductor over the one layer of the fourth insulator, the second wafer further comprising another layer of the fourth insulator over the second semiconductor, the third insulator and the fourth insulator configured to be etch-selective to each other;
    bonding the front side of the first wafer to the front side of the second wafer, via at least one dielectric bonding material, to form a bonded wafer;
    removing the second substrate from the bonded wafer; and
    forming a stack of transistor devices with the first semiconductor used as a first channel for a first transistor and the second semiconductor used as a second channel for a second transistor.

2. The method of claim 1, wherein the bonding the front side of the first wafer to the front side of the second wafer comprises:
    bonding a first dielectric layer, which is on the front side of the first wafer, to a second dielectric layer, which is on the front side of the second wafer.

3. The method of claim 2, wherein:
    the first dielectric layer and the second dielectric layer comprise a same dielectric bonding material, and
    the bonding the first dielectric layer to the second dielectric layer comprises performing fusion bonding.

4. The method of claim 1, further comprising patterning the bonded wafer to form at least one layer stack over the first substrate, wherein the at least one layer stack comprises:
    the first semiconductor over the first substrate;
    the at least one dielectric bonding material over the first semiconductor; and
    the second semiconductor over the at least one dielectric bonding material.

5. The method of claim 4, further comprising:
    uncovering opposing sidewalls of the at least one layer stack; and
    forming source/drain (S/D) regions on opposing sides of the first semiconductor and opposing sides of the second semiconductor.

6. The method of claim 4, further comprising:
    uncovering opposing sidewalls of the at least one layer stack;
    uncovering top and bottom surfaces of the first semiconductor and top and bottom surfaces of the second semiconductor; and
    forming gate structures around the first semiconductor and the second semiconductor.

7. The method of claim 4, further comprising:
    uncovering opposing sidewalls of the at least one layer stack; and
    replacing end portions of insulator layers with dielectric spacers, the insulator layers respectively being in direct contact with the first semiconductor and the second semiconductor.

8. The method of claim 1, wherein:
    the receiving the first wafer comprises forming the first SOI stack over the first substrate and forming the another layer of the second insulator over the first SOI stack,
    the receiving the second wafer comprises forming the second SOI stack over the second substrate and forming the another layer of the fourth insulator over the second SOI stack, and
    the one layer of the second insulator is in direct contact with the first insulator.

9. The method of claim 1, wherein the bonding the front side of the first wafer to the front side of the second wafer, via the at least one dielectric bonding material, to form the bonded wafer comprises:
bonding a first dielectric layer, which is over the another layer of the second insulator of the first wafer, directly to a second dielectric layer, which is over the another layer of the fourth insulator of the second wafer,
wherein the first dielectric layer and the second dielectric layer comprise a same dielectric material, and there is no bonding defect between the first dielectric layer and the second dielectric layer.

10. The method of claim 1, wherein:
the first transistor comprises a first channel that is single crystalline, and
the second transistor comprises a second channel that is single crystalline.

11. The method of claim 10, wherein:
the first semiconductor over the one layer of the second insulator is single crystal silicon, and
the second semiconductor over the one layer of the fourth insulator is single crystal germanium.

12. A semiconductor device, comprising:
a substrate;
a stack of transistors over the substrate, the stack of transistors comprising a first transistor and a second transistor stacked over the first transistor, wherein the first transistor comprises a first channel surrounded by a first gate structure, and first S/D regions on opposing ends of the first channel, and the second transistor comprises a second channel surrounded by the second gate structure, and second S/D regions on opposing ends of the second channel;
an isolation structure positioned between the first transistor and the second transistor, the isolation structure comprising a first dielectric layer, which is in direct contact with the first gate structure of the first transistor, and a second dielectric layer, which is in direct contact with the second gate structure of the second transistor; and
a common vertical conductive structure that is in direct contact with one of the first S/D regions and one of the second S/D regions,
wherein the first dielectric layer is directly bonded to the second dielectric layer.

13. The semiconductor device of claim 12, wherein:
the first dielectric layer and the second dielectric layer comprise a same dielectric material,
there is no bonding defect between the first dielectric layer and the second dielectric layer, and
the first dielectric layer is bonded seamlessly to the second dielectric layer.

14. The semiconductor device of claim 12, wherein:
the first dielectric layer is bonded to the second dielectric layer with one or more bonding defects at a bonding interface between the first dielectric layer and the second dielectric layer, and the one or more bonding defects include at least one selected from the group consisting of a trapped particle and a crack.

15. The semiconductor device of claim 12, wherein:
at least one channel of the stack of transistors comprises an elemental semiconductor or a compound semiconductor.

16. The semiconductor device of claim 12, wherein:
the first transistor comprises a first channel that is single crystalline, and
the second transistor comprises a second channel that is single crystalline.

17. The semiconductor device of claim 12, wherein:
the first transistor includes a single first channel without additional channels, and
the second transistor includes a single second channel without additional channels.

18. The semiconductor device of claim 12, wherein when viewed from a vertical direction substantially perpendicular to a working surface of the substrate:
the isolation structure completely overlaps with a first structure consisting of the first channel and the first S/D regions, and
the isolation structure completely overlaps with a second structure consisting of the second channel and the second S/D regions.

19. The semiconductor device of claim 12, wherein in a vertical direction substantially perpendicular to a working surface of the substrate:
the common vertical conductive structure is longer than the first transistor, the isolation structure and the second transistor combined.

20. A semiconductor device, comprising:
a substrate;
a stack of transistors over the substrate, the stack of transistors comprising a first transistor and a second transistor stacked over the first transistor, wherein the first transistor comprises a first channel surrounded by a first gate structure, and first S/D regions on opposing ends of the first channel, and the second transistor comprises a second channel surrounded by the second gate structure, and second S/D regions on opposing ends of the second channel;
an isolation structure positioned between the first transistor and the second transistor, the isolation structure comprising a first dielectric layer, which is in direct contact with the first gate structure of the first transistor, and a second dielectric layer, which is in direct contact with the second gate structure of the second transistor; and
a common vertical conductive structure that is in direct contact with one of the first S/D regions and one of the second S/D regions,
wherein the first dielectric layer is directly bonded to the second dielectric layer, the first channel of the first transistor comprises single crystal silicon, and the second channel of the second transistor comprises single crystal germanium.

* * * * *